United States Patent
Gabl et al.

(10) Patent No.: US 11,473,213 B2
(45) Date of Patent: Oct. 18, 2022

(54) METHOD AND APPARATUS FOR MANUFACTURING PHOTONIC CRYSTALS

(71) Applicant: D. Swarovski KG, Wattens (AT)

(72) Inventors: Christian Gabl, Kematen (AT); Christian Lipp, Vomp (AT); Nina Stepanik, Wattens (AT); Christina Streiter, Wattens (AT); Roy Layne Howell, Gainesville, FL (US); Georg Czermak, Wattens (AT); Matthias Gander, Landeck (AT); Wolfgang Stiglitz, Rum (AT)

(73) Assignee: D. Swarovski KG, Wattens (AT)

( * ) Notice: Subject to any disclaimer, the term of this patent is extended or adjusted under 35 U.S.C. 154(b) by 0 days.

(21) Appl. No.: 16/957,593

(22) PCT Filed: Dec. 28, 2018

(86) PCT No.: PCT/IB2018/001549
§ 371 (c)(1),
(2) Date: Jun. 24, 2020

(87) PCT Pub. No.: WO2019/130058
PCT Pub. Date: Jul. 4, 2019

(65) Prior Publication Data
US 2020/0347517 A1 Nov. 5, 2020

Related U.S. Application Data
(60) Provisional application No. 62/610,995, filed on Dec. 28, 2017.

(51) Int. Cl.
*C30B 30/06* (2006.01)
*C01B 33/12* (2006.01)
(Continued)

(52) U.S. Cl.
CPC .............. *C30B 30/06* (2013.01); *C01B 33/12* (2013.01); *C30B 29/16* (2013.01); *C30B 29/60* (2013.01);
(Continued)

(58) Field of Classification Search
CPC ......... C30B 30/06; C30B 29/16; C30B 29/60; C30B 35/007; C01B 33/12; B82Y 20/00;
(Continued)

(56) References Cited

U.S. PATENT DOCUMENTS

| | | |
|---|---|---|
| 2010/0040741 A1 | 2/2010 | Butler |
| 2010/0190760 A1* | 7/2010 | Ruecroft .................... B01J 2/18 514/178 |
| 2011/0233476 A1* | 9/2011 | Arsenault .............. C09D 11/52 252/500 |

FOREIGN PATENT DOCUMENTS

| | | |
|---|---|---|
| CN | 1559911 | * 10/2005 |
| CN | 102020268 A | 4/2011 |

(Continued)

OTHER PUBLICATIONS

International Search Report and Written Opinion of the International Searching Authority; International Application No. PCT/IB2018/001549; Jun. 19,2 019; European Patent Office; Rijswijk, Netherlands.

(Continued)

*Primary Examiner* — Robert M Kunemund
(74) *Attorney, Agent, or Firm* — Stevens & Showalter LLP

(57) ABSTRACT

A method of making a liquid dispersion for the manufacture of a photonic crystal. The method comprises dispersing monodispersed spheres in a liquid to form a liquid dispersion, and subjecting the liquid dispersion to an ultrasonic treatment. Ammonia solution may also be added to the liquid (Continued)

dispersion. The ultrasound treatment breaks up agglomerations of monodispersed spheres, and the resulting photonic crystal made using the dispersion is more highly ordered and hence of higher quality.

18 Claims, 18 Drawing Sheets

(51) Int. Cl.
    *C30B 29/16*      (2006.01)
    *C30B 29/60*      (2006.01)
    *C30B 35/00*      (2006.01)
    *B82Y 20/00*      (2011.01)
    *B82Y 40/00*      (2011.01)
    *G02B 1/00*      (2006.01)
    *G02B 6/122*      (2006.01)

(52) U.S. Cl.
    CPC .............. *C30B 35/007* (2013.01); *B82Y 20/00* (2013.01); *B82Y 40/00* (2013.01); *C01P 2002/02* (2013.01); *C01P 2004/32* (2013.01); *C01P 2004/62* (2013.01); *C01P 2006/60* (2013.01); *G02B 1/005* (2013.01); *G02B 6/1225* (2013.01)

(58) Field of Classification Search
CPC .. B82Y 40/00; C01P 2002/02; C01P 2004/33; C01P 2004/62; C01P 2006/60
See application file for complete search history.

(56) References Cited

FOREIGN PATENT DOCUMENTS

| | | |
|---|---|---|
| CN | 103884710 A | 6/2014 |
| JP | 2009092616 A | 4/2009 |
| TW | 200613215 A | 5/2006 |

OTHER PUBLICATIONS

Examination Report; Taiwan application No. 107147178; Taiwan Intellectual Property Office; dated Jul, 29, 2022; Taipei, Taiwan.

\* cited by examiner

METHOD AND APPARATUS FOR MANUFACTURING PHOTONIC CRYSTALS

TECHNICAL FIELD

The invention relates to a method and apparatus for manufacturing photonic crystals, in particular synthetic opal. Aspects of the invention relate to a method and apparatus for making a liquid dispersion for use in the manufacture of photonic crystals, a liquid dispersion made by the method, a method of making photonic crystals using a liquid dispersion, a mould for making photonic crystals, and a method of making photonic crystals using the mould.

BACKGROUND

It has been known to produce synthetic opal using a process, in which monodispersed spheres (i.e. spheres of substantially the same diameter) are arranged in an ordered structure to form a photonic crystal, and are stabilised by a filler. The diameter of the particles is in the range of the wavelengths of visible light, such that the photonic crystal diffracts light in the visible spectrum to create the well-known play of colors displayed by an opal. To enable this diffraction of light the refractive index of the filler must differ from the refractive index of the particles. Typically, the monodispersed spheres are silica ($SiO_2$) and the filler is zirconium oxide ($ZrO_2$), though other materials may be used.

U.S. Pat. No. 4,703,020 describes such a process of making synthetic opals using a sol gel process. Silica spheres are dispersed in water by stirring and are left to sediment, where they will naturally arrange in mass having an ordered structure. The mass is dried and then immersed in a zirconium-containing solution. During the immersion, zirconium oxide is precipitated out by hydrolysis to form the filler. Finally, the structure is calcined to leave a finished synthetic opal.

While such processes are effective in producing synthetic opals, they are typically slow, and require many process steps. A high degree of ordering of the photonic crystal is necessary to produce quality opals, and a long period is therefore required for sedimentation. Drying, hydrolysis and sintering steps also take a long time, meaning that manufacture typically takes many weeks from start to finish.

Furthermore, each individual opal stone must be separately created, with each process step carries out on each individual stone. The process is therefore heavily reliant on manual input and as such is typically conducted as small batch processes. Attempts to speed up the process or reduce manual input tend to compromise the quality of the opal, and as such, high through-put manufacture of high quality synthetic opal has been historically difficult.

The present invention has been devised to mitigate or overcome at least some of the above-mentioned problems.

SUMMARY OF THE INVENTION

According to an aspect of the present invention there is provided a method of making a liquid dispersion for the manufacture of a photonic crystal. The method comprises dispersing monodispersed spheres in a liquid to form a liquid dispersion, and subjecting the liquid dispersion to an ultrasonic treatment.

Subjecting the liquid dispersion to an ultrasound treatment in this way breaks up agglomerations of the monodispersed spheres in the liquid dispersion. When the liquid dispersion is used to make a photonic crystal, the spheres are allowed to settle under gravity to form an ordered structure that defines the photonic crystal. Agglomerations break the ordering of the structure, which reduces the quality of the visual appearance of the photonic crystal. In particular, it reduces the transparency of the crystal and the fire of the crystal (a high fire meaning that when the photonic crystal disperses the incoming light into different wavelengths, the beams corresponding to the different wavelengths are well-separated, such that different colours are distinctly visible in the outgoing light). Thus, the liquid dispersion produced by this method has fewer agglomerations and thus when used to make photonic crystals it produces a more highly ordered crystal structure, resulting in superior transparency and fire in the finished photonic crystal.

The method may comprise dispersing the monodispersed spheres in water to form the liquid dispersion. The method may also comprise adding ammonia solution to the liquid dispersion. Ammonia is beneficial because it guard against re-agglomeration of the spheres after the ultrasound treatment has broken up agglomerations. In this way, the use of the ultrasound treatment and the use of ammonia act synergysticlly to remove agglomerations and avoid their reformation even after the ultrasound treatment has been carried out.

A ratio of water to ammonia solution by weight may preferably be between approximately 1.0:0.01 and 1.0 to 0.2, and is preferably approximately 1.0:0.05. This amount of ammonia is high enough to guard against re-agglomeration effectively, but low enough to reduce health and safety concerns.

The method may comprise subjecting the liquid dispersion to a further ultrasonic treatment, such that the dispersion is subjected to first and second ultrasonic treatments. In particularly preferred embodiments, the dispersion may be subjected to first, second and third ultrasonic treatments. Applying three ultrasound treatments has been found to be particularly effective in removing agglomerations to provide high quality photonic crystals.

The method may comprise allowing the liquid dispersion to cool between the ultrasonic treatments.

The method may comprise allowing the liquid dispersion to cool for a cooling period, and the or each cooling period may have a duration that is between approximately 2 minutes and approximately 60 minutes, preferably approximately 10 minutes or approximately 30 minutes.

Where ammonia is added, the method may comprise adding ammonia solution to the liquid dispersion after subjecting the liquid dispersion to an ultrasonic treatment. Where multiple ultrasonic treatments are used, the ammonia may be added after the first treatment or after subsequent treatments such as the second treatment. Adding the ammonia at a later stage helps to reduce evaporation of the ammonia during ultrasound treatments, which might otherwise be a health and safety concern.

The method may comprise subjecting the liquid dispersion to the or each ultrasonic treatment for an ultrasonic treatment period. The ultrasonic treatment period may have a duration that is between approximately 10 seconds and approximately 20 minutes, and that is preferably approximately 15 seconds or approximately 5 minutes.

A ratio of water to monodispersed spheres by weight may be between approximately 1.00:0.08 and approximately 1.0:2.0, preferably approximately 1.2:1.0.

The monodispersed spheres may have a mean diameter of between 300 nm and 600 nm, and may preferably have a mean diameter of 350 nm, 420 nm, 450 nm or 550 nm.

The method may comprise continuously feeding the dispersion into a first ultrasound volume to undergo a first ultrasonic treatment. The method may comprise continuously feeding the dispersion from the first ultrasound volume to a first cooling volume to undergo cooling.

The method may comprise continuously feeding the dispersion from the first cooling volume to a second ultrasound volume to undergo a second ultrasonic treatment. In this case, the method may comprise continuously feeding the dispersion from the second ultrasound volume to a second cooling volume to undergo cooling. Where two ultrasound volumes are used, the method may comprise pumping the dispersion through the first ultrasound volume at a first flow rate and pumping the dispersion through the second ultrasound volume at a second flow rate, the second flow rate being lower than the first flow rate.

In other embodiments, after cooling, the method may comprise continuously feeding the dispersion from the first cooling volume back to the first ultrasound volume to undergo a second ultrasonic treatment. In this case, the method may comprise continuously feeding the dispersion from the first ultrasound volume back to the first cooling volume to undergo cooling, or to a second cooling volume to undergo cooling.

The method may comprise pumping the dispersion through the first ultrasound volume for the first ultrasonic treatment at a first flow rate and pumping the dispersion through the first ultrasound volume for the second ultrasonic treatment at a second flow rate, the second flow rate being lower than the first flow rate.

The invention also extends to a liquid dispersion for use in the manufacture of a photonic crystal, the liquid dispersion comprising monodispersed spheres dispersed in a liquid. The monodispersed spheres have a mean average diameter that is between 300 and 600 nm, and the liquid dispersion comprises water and ammonia solution. The presence of ammonia has been found to result in less agglomeration of the particles in the liquid dispersion, which provides a more ordered structure and hence a finished crystal with superior transparency and fire.

The liquid may comprise water and ammonia solution in the ratio of between approximately 1:0.01 and approximately 1:0.2 by weight. Preferably the liquid comprises water and ammonia solution in the ratio of approximately 1:0.05 by weight. This ratio has been found to be particularly beneficial because it provides a balance between sufficient ammonia to produce a superior crystal, but it a low enough amount of ammonia that health and safety concerns are kept to a minimum.

The invention extends further to apparatus for continuously making a liquid dispersion for use in making a photonic crystal. The apparatus comprises an ultrasound volume comprising ultrasound apparatus for applying an ultrasound treatment to a liquid; a cooling volume in fluid communication with the ultrasound volume for cooling treated liquid dispersion received from the ultrasound volume into the cooling volume; and a pump for pumping liquid from the ultrasound volume to the cooling volume.

The pump may also be configured to pump liquid from the cooling volume to the ultrasound volume to apply a further ultrasound treatment to the liquid. To this end, the apparatus may comprise a further cooling volume in fluid communication with the ultrasound volume, wherein the pump is configured to pump liquid between the cooling volume and the further cooling volume via the ultrasound volume to apply the further ultrasound treatment.

In other embodiments a further ultrasound treatment may be applied using a further ultrasound volume. To this end, the apparatus may comprise a further ultrasound volume in fluid communication with the cooling volume, and a further cooling volume in fluid communication with the further ultrasound volume.

The apparatus may also comprise a further pump for pumping liquid from the cooling volume to the further cooling volume via the further ultrasound volume. In this case, the further pump may be configured to pump liquid at a slower rate than the pump.

The or each cooling volume may comprise stirring apparatus to stir liquid dispersion in the cooling volume during cooling.

In any of the aspects described above, the or each ultrasound volume may be an ultrasonic cell, and/or the or each cooling volume may be a cooling tank.

The invention also encompasses a method of making a photonic crystal. The method comprises: making a liquid dispersion comprising monodispersed spheres according to the method described above or providing the liquid dispersion described above; providing a mould having a liquid-receiving cavity; filling the cavity with the liquid dispersion; allowing the monodispersed spheres to sediment; allowing the sedimented spheres to dry; and filling spaces between the spheres with a filler material to form the photonic crystal.

The invention further encompasses a method of making a plurality of photonic crystals. The method comprises: making a liquid dispersion according to the method described above, providing the liquid dispersion described above, or providing any other liquid dispersion suitable for making a photonic crystal, the liquid dispersion comprising monodispersed spheres; providing a mould arrangement having a plurality of liquid-receiving cavities; simultaneously filling at least some of the plurality of cavities with the liquid dispersion; allowing the monodispersed spheres to sediment; allowing the sedimented spheres to dry; and filling the spheres with a filler material to form the photonic crystals.

In either method described above, after the drying stage, the sedimented spheres are referred to as an opal cake. The method may comprise a step of calcining the or each opal cake, which may comprise heating the or each opal cake.

The or each opal cake may be transferred to a heating volume such as a furnace to undergo heating. The transfer step may include removing the or each opal cake from the mould to a support surface to transfer the or each opal cake to the heating volume. In this case, the method may comprise arranging the or each opal cake on the support surface so that a meniscus of the or each opal cake (defined by the exposed liquid surface in the mould) faces upwardly, away from the support surface. In this way, the or each opal cake does not rest on the uneven meniscus surface but instead rests on its flat base surface during the calcining step, which reduces the chance of breakage during calcining. To arrange the or each opal cake in this way, the or each opal cake may be inverted from the mould onto a temporary support surface, and then inverted once more from the temporary support surface to the support surface for the calcining stage.

The or each calcined opal product may be located in the mould for the filling stage. In this case, the mould may be filled with a first immersion liquid to allow the first immersion liquid to infiltrate between the ordered spheres. The mould may then be filled with a second immersion liquid that reacts with the first immersion liquid to form the filler.

After the filling stage the or each filled opal product may be sintered, which may comprise heating the or each filled opal product. The or each filled opal product may be transferred to a heating volume such as a furnace to undergo heating. This may involve transferring the or each filled opal product to a support surface in the manner already described above in relation to the calcining step.

In any of the aspects described above the monodispersed spheres may be monodispersed silica spheres.

From another aspect, the invention resides in a mould for making a plurality of photonic crystals. The mould comprises a support for supporting a plurality of mould modules, and a plurality of mould modules receivable in the support, wherein each mould module comprises a plurality of cavities, each cavity being configured to receive a liquid dispersion to make a photonic crystal in the cavity.

The modular nature of the mould allows for flexibility in the manufacturing process. Different mould modules may comprise cavities of different sizes or shapes, so that the mould can be adapted to produce photonic crystals having different sizes and shapes. In this way, the mould can be adapted each time it is used to meet customer demand. If necessary, a plurality of different sizes and shapes of crystals can be made simultaneously in the same mould.

The mould modules and the support may be configured for releasable engagement with one another.

The support may comprise a plurality of mould zones, each mould zone being configured to receive a mould module. Each mould zone may comprise at least one engagement formation, and each mould module may comprise at least one corresponding engagement formation.

The engagement formations on the support and the mould modules may be configured for releasable engagement. To this end, the engagement formations on the support and the mould modules may comprise a first engagement formation comprising a recess and a second engagement formation comprising a protrusion that is releasably engageable in the recess.

The protrusion may be provided on the mould module. In this case, the mould module may comprise a mould body that supports the cavities, and the protrusion may be provided on a tab that depends from the mould body. Optionally, the protrusion may be provided at an end of the tab. The protrusion may be a ridge that is provided on the tab. In this case the ridge may extend across the tab.

The mould module may comprises one or more lugs configured to rest on a support surface of the support when the mould module is engaged with the support. If a tab is also provided, the mould module may comprises first and second lugs at an end of the mould body, and the tab may depend from the mouls body at a location between the lugs. The tab and the lugs may be substantially orthogonal.

The recess may be provided on the support. The support may define a module-receiving space, and the recess may be provided on an inner surface of the support that faces the module-receiving space.

The recess may be defined by a channel in the inner surface of the support.

The channel may extend only partially along the inner surface of the support, so as to stop short of a support surface of the support.

An end of the channel may be spaced away from the support surface of the support by a distance that is approximately equal to a spacing between the lugs and the protrusion of the mould module. In this way, when the protrusion on the mould module is engaged at the end of the channel on the support, the lugs of the mould module may contact the support surface of the support.

The invention also extends to a method of making a plurality of photonic crystals, the method comprising selecting at least two mould modules from a plurality of mould modules, each mould module having a plurality of cavities with a shape and/or dimension that corresponds to a desired shape and/or dimension of the photonic crystals; arranging the at least two mould modules on a support to assemble a mould assembly; filling the plurality of cavities with a liquid dispersion comprising monodispersed spheres dispersed in a liquid; allowing the spheres to sediment within the cavities to form the photonic crystals.

For efficiency of process, the method may comprise filling a plurality of cavities simultaneously, for example, using a multihead pipette. The method may comprise filing all the cavities of a mould module simultaneously.

The two mould modules may have cavities having a different shape and/or dimension. Alternatively, the two mould modules may have cavities having substantially the same shape and/or dimension.

The method may comprise pushing a complementary engagement feature on each mould module into releasable engagement with a corresponding engagement feature on the support to arrange the mould modules on the support. To this end, the method may comprise pushing a respective protrusion on the mould modules into releasable engagement with a corresponding recess on the support.

To locate the modules securely on the support, the method may comprise pushing at least one lug on each mould module into contact with a support surface on the support.

The invention also extends to a photonic crystal produced by any method above or using any liquid dispersion above.

In any of the aspects described above, the photonic crystal may be a synthetic opal.

Within the scope of this application it is expressly intended that the various aspects, embodiments, examples and alternatives set out in the preceding paragraphs, in the claims and/or in the following description and drawings, and in particular the individual features thereof, may be taken independently or in any combination. That is, all embodiments and/or features of any embodiment can be combined in any way and/or combination, unless such features are incompatible. The applicant reserves the right to change any originally filed claim or file any new claim accordingly, including the right to amend any originally filed claim to depend from and/or incorporate any feature of any other claim although not originally claimed in that manner.

BRIEF DESCRIPTION OF THE DRAWINGS

One or more embodiments of the invention will now be described, by way of example only, with reference to the accompanying drawings, in which:

FIG. 4b is a perspective view of a support forming a part of the apparatus of FIG. 4a;

FIGS. 4b to 4f are perspective views of mould modules forming part of the apparatus of FIG. 4a; and FIGS. 5a to 5h illustrate schematically stages in a process of making a plurality of synthetic opals using the modular mould arrangement of FIG. 4a.

DETAILED DESCRIPTION

Figure 1:
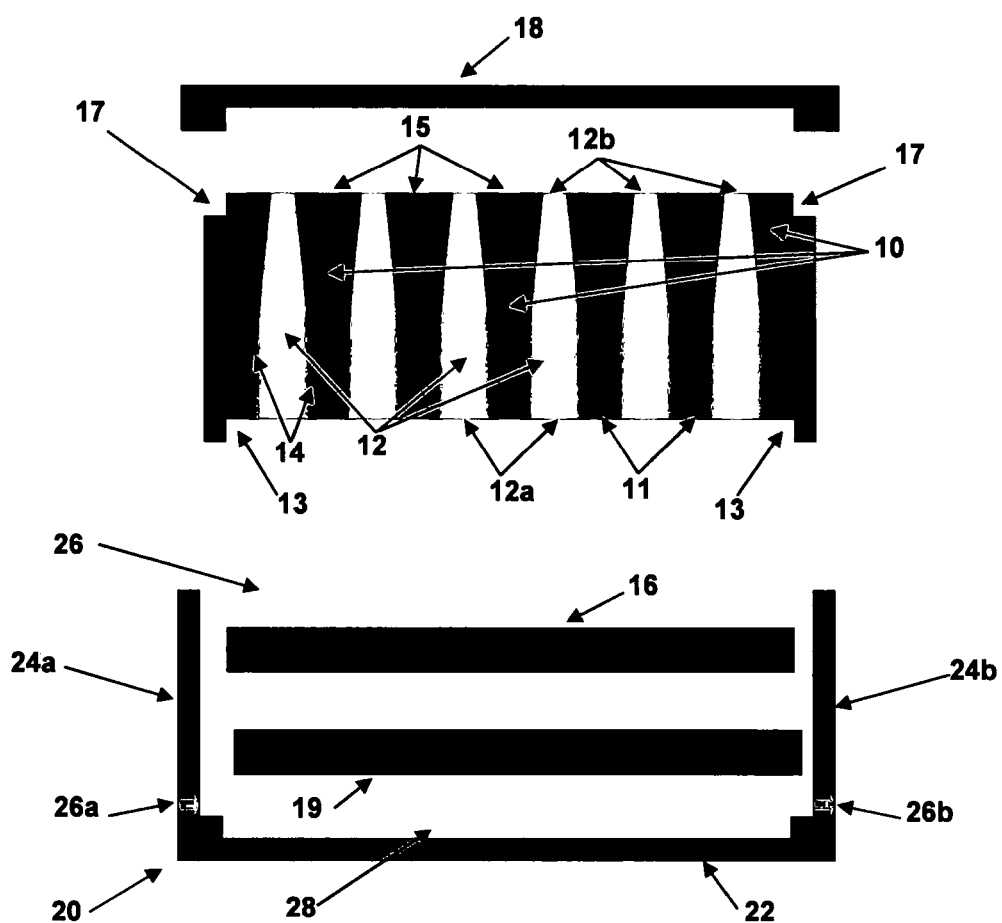
FIG. 1 is an exploded front-plan view of apparatus for making a plurality of photonic crystals such as synthetic opals.

Apparatus for making a photonic crystal, which is exemplified in the forgoing description as a synthetic opal, is illustrated in FIG. 1. The apparatus comprises a mould 10, upper and lower supports 16, 18, 19 and a container 20.

The mould 10 comprises a plurality of cavities 12, each cavity being shaped substantially as a cylinder having a diameter of approximately 6.5 mm. Each cavity 12 is open at the top and base of the mould 10 to define lower and upper openings 12a, 12b. Walls 14 of the cavities 12 are tapered slightly inwards towards the top, such that the diameter of the cavity is slightly larger at the base of the mould 10 than at the top of the mould 10 to define a taper angle of 1°. This taper facilitates de-moulding of the opals that are formed in the cavities 12.

A lower surface 11 of the mould 10 is provided with a rim 13 in the form of a downward protrusion that extends at least partly around the periphery of the lower surface 11. An upper surface 15 of the mould 10 is provided with a detent 17 that at least partially surrounds the periphery of the upper surface 15.

The mould 10 is a plate that is made from a plastics material, in particular polypropylene or Teflon, or from any other suitable material. In this example, the mould 10 has a width of 80 mm, a length of 120 mm and a height of between 4 mm and 30 mm, though any suitable dimensions may be used. The cavities 12 have a mean diameter of 1.8 mm. A large number of cavities 12, for example 1600 cavities, are provided on a single mould 10.

A lower support 16 in the form of a lower support plate is provided to close off the lower openings 12a of the cavities 12 at the base of the mould 10, and an upper support 18 in the form of an upper support plate is provided to close off the upper openings 12b of the cavities 12 at the top of the mould 10.

A further lower support in the form of a sinter plate 19 is also provided, which is interchangeable with the lower support plate 16 as needed during the process. The sinter plate 19 is made of a material that can withstand high temperatures, such as a fused silica.

A container 20 is configured to receive a liquid, and to receive the mould 10 and support plate 16, 18. The container 20 comprises a base 22 and side walls 24a, 24b, and is open at the top to define an opening 26. An inlet 26a is provided on one side wall, in this case the left side wall 24a, to allow liquid to flow into the container 20, and an outlet 26b is provided on another side wall, in this case the right side wall 24b, to allow liquid to flow out of the container 20.

The base 22 of the container 20 is formed with a recess 28 at its centre. The recess 28 is dimensioned to receive the lower support 16. The upper support 18 may close off the opening 26 of the container 20 so as to form a lid of the container 20.

The container 20 is made from a plastics material, in particular polypropylene of Teflon, or from any other suitable material. The dimensions of the container 20 are slightly larger than the mould 10 (i.e. slightly larger than 80 mm in width and 120 mm in length and 10 to 30 mm high) so that the mould 10 fits snugly into the container 20.

A process for making a pre-prepared liquid dispersion for use with the above apparatus in making a synthetic opal will now be described with reference to FIGS. 2a and 2b.

Figure 2A:
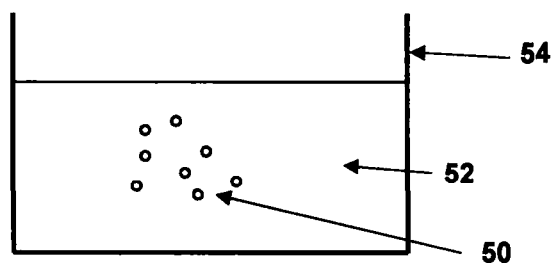
FIGS. 2a and 2b are cross-sectional views of apparatus for use in a batch process of making a dispersion liquid for use in making photonic crystals using the apparatus of FIG. 1.

As shown in FIG. 2a, monodispersed silica spheres 50 and demineralised water 52 are first added to a container 54.

In a particular embodiment, 100.00 g of monodispersed silica spheres 50 are added to 120.00 g or 120.00 ml of water 52. However, it will be appreciated that other volumes may be used, which may be in a silica sphere:water ratio of 1.0:1.2 by weight, or in any other suitable ratio. For example, the silica sphere:water ratio may be as low as 0.08:1 or as high as 2:1. In the finished opal product, the concentration of silica spheres will affect the total volume of silica and hence the size of the resulting opal. Since the diameter of the opal is fixed by the mould, the only variable dimension is the height, thus in practice the concentration will affect the height of the opal. The concentration may therefore be varied according to the height that is desired in the finished opal.

Monodispersed means that the spheres are all of substantially the same diameter. It will be appreciated that a small degree of variation is to be expected in practice. For monodispersed spheres 50, this variation is typically less than 5% of the specified diameter: so for example, monodispersed spheres 50 having a mean diameter of 300 nm might be expected to have a diameter range of 285 nm to 315 nm.

The monodispersed silica spheres 50 are specifically selected such that the mean diameter is between 300 nm and 600 nm. This selected diameter is within the wavelength of visible light, which will give rise to the desired colour effects in the finished opal.

The specific particle size is selected according to the desired colour of the final opal. For example, 350 nm spheres are selected for a blue colour, 420 nm spheres or 450 nm spheres are selected for a green/blue colouring, and 550 nm spheres are selected for a red/green colouring.

Figure 2B:
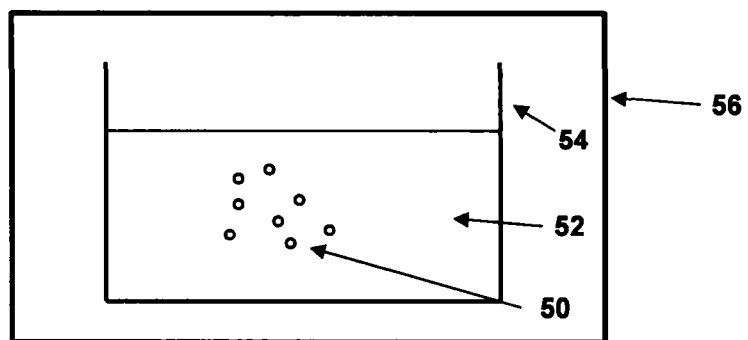

The mixture is stirred and subjected to ultrasonic dispersion as illustrated in FIG. 2b. In this step, the container 54 is placed in a soundproof enclosure 56 and subjected to ultrasonic vibrations for a period of 5 minutes using, for example, a Branson S450A CE 400W, Sonotrode 19 mm with an ultrasound frequency of 20 kHz, though other ultrasound devices may be used operating at other suitable frequencies. The ultrasonic vibrations act to disperse the silica spheres 50 particularly effectively within the liquid and to split up agglomerated groups of silica spheres 50. Avoiding agglomerations results in a more ordered structure when the silica spheres 50 are sedimented, which improves the quality of the finished opal.

The ultrasonic vibrations cause the liquid to heat up during the ultrasound process. When the ultrasound vibrations are halted, the liquid is allowed to cool back to room temperature in a water bath at 10° C. for a period of 10 minutes (though other appropriate cooling times may be used). After cooling, the liquid is stirred once more, and the process of ultrasonic treatment for a five minute interval, followed by cooling for a 10 minute interval, is repeated to provide for particularly thorough dispersion. Breaking the ultrasound process into multiple steps in this way avoids overheating of the liquid whilst still breaking up agglomerated particles effectively.

Ammonia solution is then optionally added to the container 54. In this particular embodiment, 5.0 g or 5.7 ml of 32% ammonia solution is added, providing a silica:water:ammonia ratio of 1.0:1.2:0.05 by weight, though other suitable amounts and ratios could be used, for example between 1.0 g to 10.0 ml of ammonia in 100 g of water. In other embodiments the ammonia may be omitted altogether.

The inventors have found that after the ultrasound process has broken up agglomerates, the silica particles 50 are particularly prone to re-agglomeration, as a result of their small and uniform size. The ammonia solution acts to ionise the surfaces of the silica spheres 50, which provides repellent electrostatic forces that prevent this re-agglomoration of the spheres 50. This ensures that the silica spheres 50 remain separate as the liquid is used in later processes. The mixture is stirred, and the ultrasound and cooling processes are repeated for a final time.

After cooling, the mixture is stirred once more and is then ready for use in making synthetic opals.

Figure 2C:
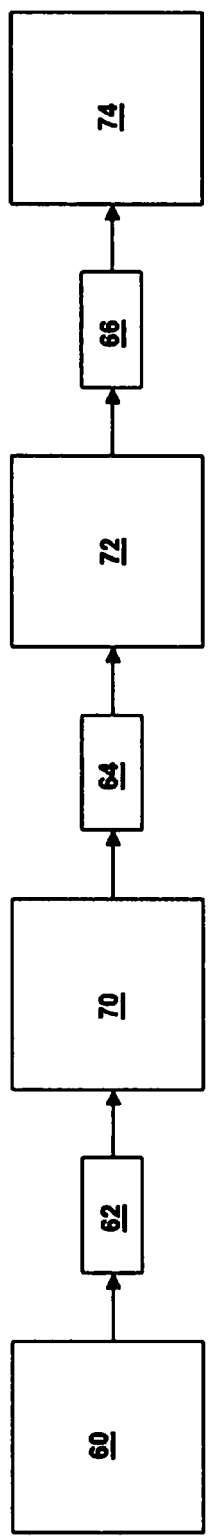
FIGS. 2c to 2e are schematic diagrams of apparatus for continuously making a dispersion liquid for use in making photonic crystals.

In another embodiment, the liquid dispersion is prepared in a continuous in-line process using the apparatus depicted schematically in FIG. 2c.

According to this embodiment, a mixture comprising monodispersed silica spheres, demineralised water and ammonia solution in the appropriate ratios is pumped through a series of mixing volumes in the form of mixing tanks, ultrasonic treatment volumes in the form of ultrasonic cells, and cooling volumes in the form of cooling tanks.

To this end, the apparatus comprises the following components arranged in series: a mixing volume in the form of a mixing tank 60 having one or more inlets for receiving components of the liquid mixture, a first ultrasound volume 62, a first cooling volume 70, a second ultrasound volume 64, a second cooling volume 72, a third ultrasound volume 66 and a third cooling volume 74 having an outlet for dispensing the liquid mixture. Pumps (not shown) pump the liquid mixture from one tank to the next via the ultrasound cells.

The ultrasound volumes may be any appropriate apparatus capable of applying an ultrasound treatment to liquid passing through it. In this case the ultrasound volumes are exemplified as ultrasonic cells, such as for example a Branson S450A CE 400W, Sonotrode 19 mm with an ultrasound frequency of 20 kHz.

The mixing and cooling volumes are exemplified as tanks. The pumps may be any suitable peristaltic pump, for example a Hei-FLOW Precision 01 or Hei-FLOW Precision 06 pump, that may pump the liquid at any suitable flow rate, for example at a flow rate that is between approximately 1 ml/minute and approximately 500 ml/min.

The mixture is pumped from the mixing tank 60 through the first ultrasonic cell 62 at a first pumping rate V1, which in this example is a rate of 200 ml/minute. The mixture undergoes a first ultrasonic treatment as it is pumped through the first ultrasonic cell 62. In this example, the cell 62 has a volume of approximately 52 ml, such that liquid is in the cell for an average time of approximately 15 seconds. The liquid is then pumped through the first cooling tank 70, at the same rate V1, where it is stirred and cooled. In this example, the tank 70 has a volume of approximately 5 litres, and typically contained 4.5 litres of liquid, such that liquid is in the tank 70 for an average time of 22.5 minutes.

The mixture is then pumped through the second ultrasonic cell 64 at a second pumping rate V2, where it undergoes a second ultrasonic treatment. The second pumping rate is preferably less than the first pumping rate, and in this example is 100 ml/minute. A higher pumping rate is preferable for the first ultrasonic treatment because during the first cycle, while larger agglomerations are still present in the liquid which might otherwise tend to clog the system, the higher pumping rate tends to reduce the tendency for clogging. Once the liquid has undergone its first ultrasonic treatment and agglomerations are reduced, a lower flow rate can be safely used.

In this example, the second cell 64 also has a volume of approximately 52 ml, such that liquid is in the cell for an average time of approximately 30 seconds. The mixture is then pumped through the second cooling tank 72 at the same rate V2, where it is stirred and cooled. In this example, the second cooling tank 72 has a volume of 5.0 litres and typically contains approximately 4.5 litres of liquid, such that liquid is typically in the second cooling tank 72 for an average time of 45 minutes.

Finally, the mixture is pumped through the third ultrasonic cell 66 to a third cooling tank 74 at a third pumping rate V3, where it undergoes a third ultrasonic treatment. The third pumping rate is preferably the same as the second pumping rate, which in this example is 100 ml/minute. In this example, the third cell 66 has a volume of approximately 52 ml, such that liquid is in the cell for an average time of 30 seconds.

The mixture is then pumped through the third cooling tank 74 at the same rate V3, where it is stirred and cooled. In this example, the third cooling tank 74 has a volume of 5.0 litres and typically contains approximately 4.5 litres of liquid, such that liquid is typically in the third tank 74 for an average time of 45 minutes.

Any or all of the cooling tanks 70, 72, 74 may be cooled to cool the liquid mixture back to room temperature between ultrasonic treatments. Any or all of the tanks 60, 70, 72, 74 may comprise stirring apparatus to stir liquid in the tanks 60, 70, 72, 74.

This continuous inline system is particularly advantageous as it allows the liquid dispersion to be made continuously to meet the high volume demands of a manufacturing process. The system may be a closed system, allowing the various treatment stages to be carried out without exposing the liquid mixture to the atmosphere. This firstly helps to preserve purity of the liquid mixture, and secondly helps to avoid loss of ammonia from the solution, which ensures sufficient ammonia is present to reduce undesirable agglomerations, and is beneficial for reasons of health and safety.

Figure 2D:
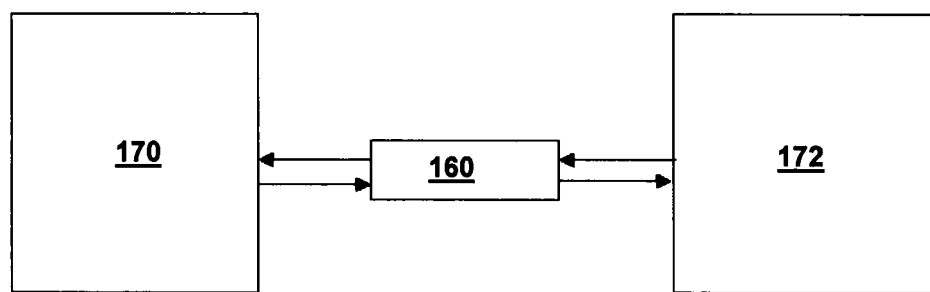
Figure 2E:
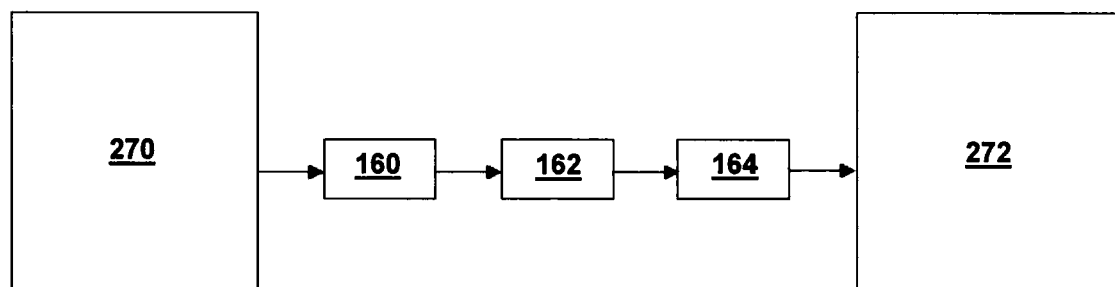

Other embodiments of the inline system are shown schematically in FIGS. 2d and 2e.

In the embodiment of FIG. 2d, the system comprises two tanks 170, 172 in fluid communication with a single ultrasonic cell 160, via pumps. The tanks 170, 172, ultrasonic cell 160 and pump are all substantially the same as those described above in relation to FIG. 2c.

The dispersion liquid is mixed in one tank 170 (or may be pre-mixed and poured into the tank 170), and is pumped between the tanks 170, 172 via the ultrasonic cell 160 multiple times to undergo multiple ultrasonic treatments. For example, once mixed, the dispersion liquid may be pumped from the first tank 170, through the ultrasonic cell 160, to the second tank 172 to undergo ultrasonic treatment. Once pumped into the second tank 172, the liquid may then be pumped from the second tank 172, back through the ultrasonic cell 160, into the first tank 170. The liquid may then be pumped a third time from the first tank 170, through the ultrasonic cell 160, to the second tank 172 to undergo a third and final ultrasonic treatment.

In the embodiment of FIG. 2e, the system comprises two tanks 270, 272 with a plurality of ultrasonic cells 160, 162, 164 between them, and a pump located between the tanks 270, 272. The dispersion liquid is mixed in a first tank 270 (or a pre-mixed liquid may be poured into the first tank), and is pumped from the first tank 270 to the second tank 272 via the plurality of ultrasonic cells 160, 162, 164 to undergo multiple ultrasonic treatments in succession before being cooled in the second tank 270. In this case, the pumping rate may be identical through each of the ultrasonic cells 160, 162, 164.

The process of making synthetic opals using the apparatus of FIG. 1 and the pre-prepared liquid dispersion produced by the method of FIGS. 2a to 2b or using the apparatus of any of FIGS. 2c to 2e, will now be described with reference to FIGS. 3a to 3x.

Figure 3A:
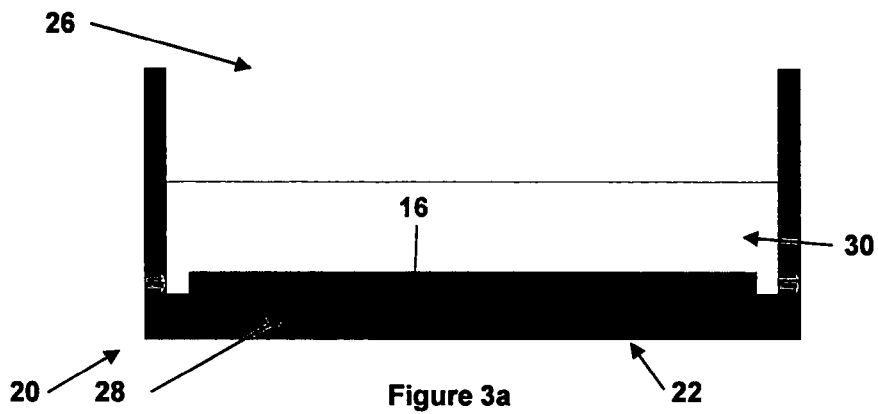
FIGS. 3a to 3x illustrate schematically stages in a process of making a plurality of synthetic opals using the apparatus of FIG. 1 and a dispersion liquid made using the apparatus of FIGS. 2a and 2b or FIG. 2c.

As shown in FIG. 3a, the lower support plate 16 is first arranged in the recess 28 on the base 22 of the container 20, so that the lower support plate 16 protrudes slightly above the base 22. The container 20 is then filled with pre-prepared liquid dispersion 30 from the inlet 26a. The volume of liquid dispersion 30 that is added to the container 20 is slightly less than the total volume of the cavities 12 of the mould 10. For example, each cavity may hold approximately 23.7 microlitres of liquid, so that if the mould contains 1600 cavities, a total of 37.9 ml of liquid is initially introduced into the container 20.

Figure 3B:
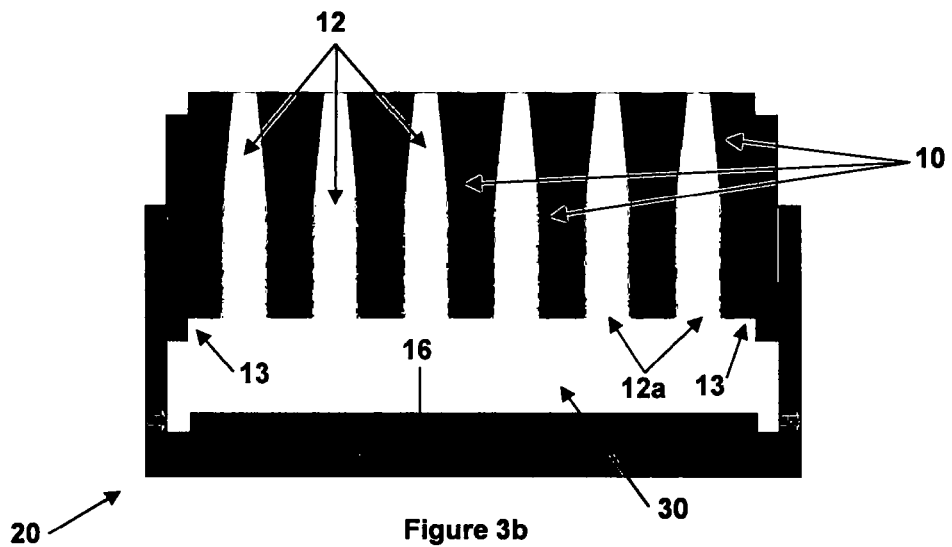
Figure 3C:
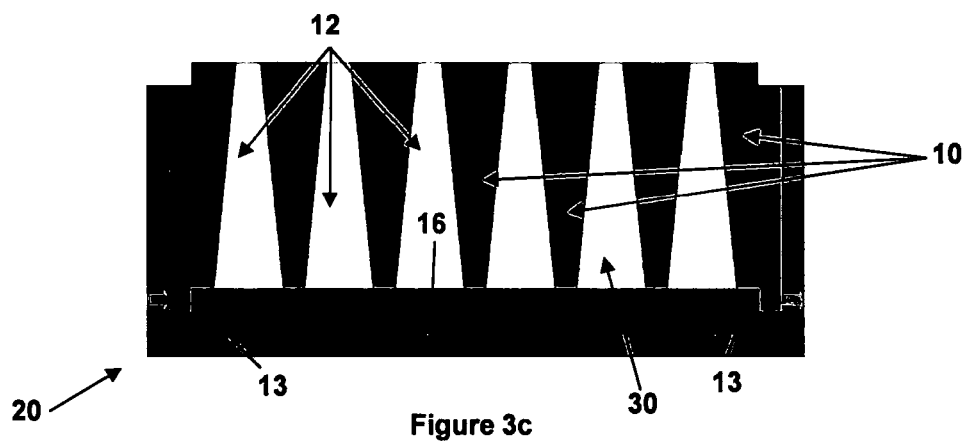

Referring to FIG. 3b, the mould 10 is lowered into the container 20 through the opening 26 at the top, and hence is lowered into the liquid 30. As the mould 10 is lowered the cavities 12 fill with the liquid 30 through the openings 12a in the base of the mould 10. Once the mould 10 has been fully lowered as shown in FIG. 3c, the mould 10 sits on top of the lower support plate 16, with the lower support plate 16 surrounded by the rim 13 of the mould 10, and the cavities 12 almost entirely filled with liquid 30.

Because the total volume of liquid 30 in the container 20 is slightly less than the total volume of all the cavities 12, the liquid does not completely fill the cavities 12, leaving a small air gap at the top of each cavity 12 to avoid the liquid spilling over the mould 10.

Figure 3D:
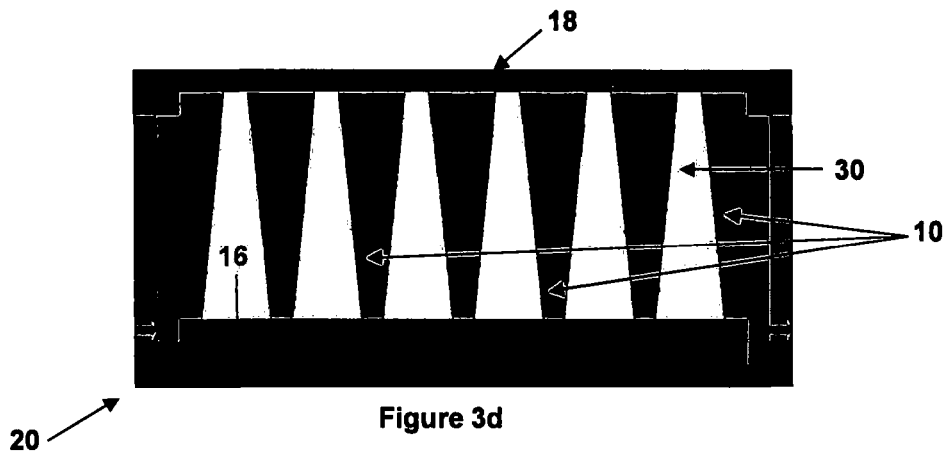

The upper support 18 is then arranged over the mould 10 and the container 20 as shown in FIG. 3d, so as to close the opening. In this way the upper support 18 acts as a lid that guards against evaporation of the liquid 30.

In this configuration, the apparatus is left to sediment for a period of time, during which the silica spheres settle into an ordered structure. Because of the combination of ultrasound treatments and ammonia in the liquid dispersion, the silica spheres are particularly resistant to agglomeration. As a result, there are very few agglomerates in the resulting ordered structure, meaning that the structure is particularly highly ordered. Because of this high degree of ordering, the resulting sedimented spheres are particularly highly ordered, with very few agglomerated regions disturbing the ordered structure.

Figure 3E:
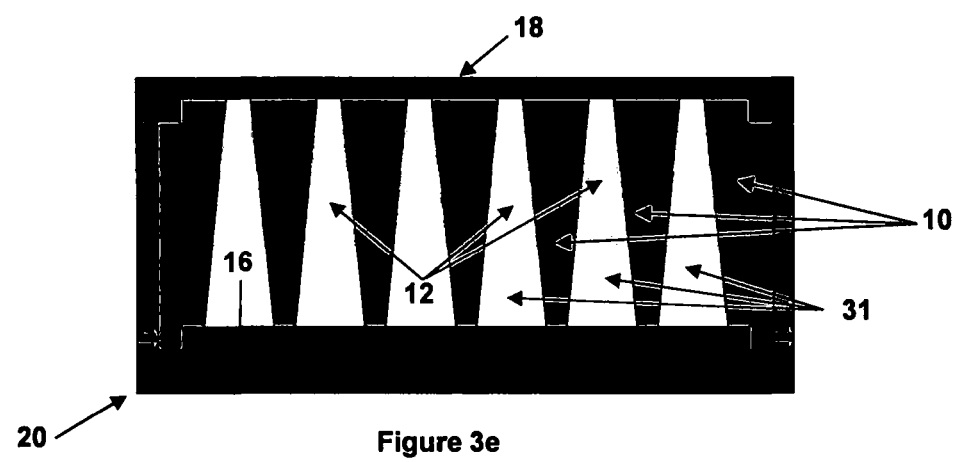

As can be seen in FIG. 3e, the settled silica spheres form a sedimented mass 31 at the base of each cavity 12 in the mould 10.

The sedimentation period is typically a week. During this time, the apparatus is kept at room temperature (20 25° C.) and in a vibration free area, so as to avoid disturbing the silica spheres as they settle.

After sedimentation is complete, the upper support 18 is removed. The remaining liquid is then allowed to evaporate in a drying process. During this drying process, the room-temperature and vibration-free conditions of the sedimentation stages are maintained. Additionally, the drying process must take place in an environment with a low and well-controlled air flow so as to allow evaporation of the liquid whilst avoiding any disturbance to the spheres as they dry.

Figure 3F:
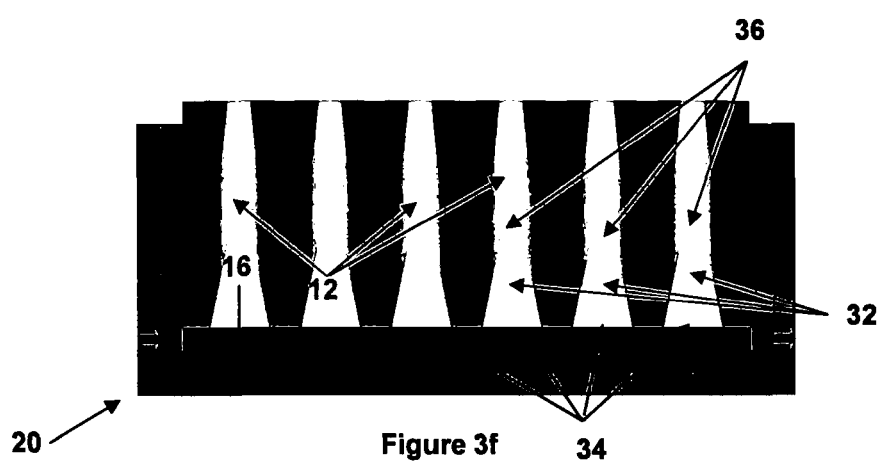

The drying stage is complete when the remaining liquid has been completely evaporated, leaving only dried opal cakes 32 remaining in the cavities 12 of the mould 10, as shown in FIG. 3f. This process typically takes several days.

The dried opal cakes 32 that result after the drying process have a planar side 34 that lies against the lower support plate 16, and a meniscus side 36 that faces upward into the cavity 12. The planar side 34 is substantially flat with a planar surface defined by the surface of the lower support plate 16. The meniscus side 34 is not flat, but is instead shaped to follow the meniscus that was present at the sediment-liquid interface after sedimentation occurred.

The dried opal cakes 32 are then transferred to the sinter plate 19 for calcining. If the dried opal cakes 32 were arranged with the meniscus side 36 against the sinter plate 19, the dried opal cakes 32 would not be stable during the sintering process due to the non-planar shape of the meniscus side 36. It is therefore preferable to arrange the dried opal cakes 32 with their planar sides 34 against the sinter plate 19. However, it is also preferable to minimise disturbance of the dried opal cakes 32, which are in a fragile state after drying.

To accommodate this balance between the need for a particular orientation and the need to minimise disturbance, the apparatus undergoes an inversion procedure to reorient the dried opal cakes.

Figure 3G:
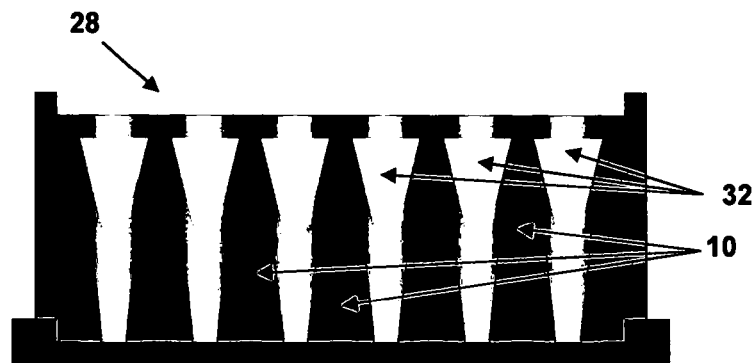
Figure 3H:
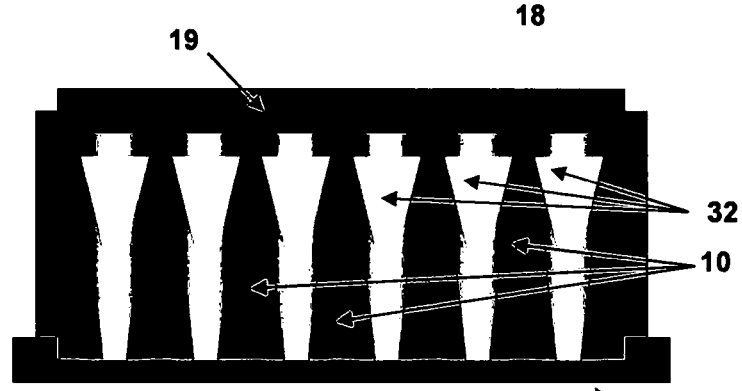
Figure 3J:
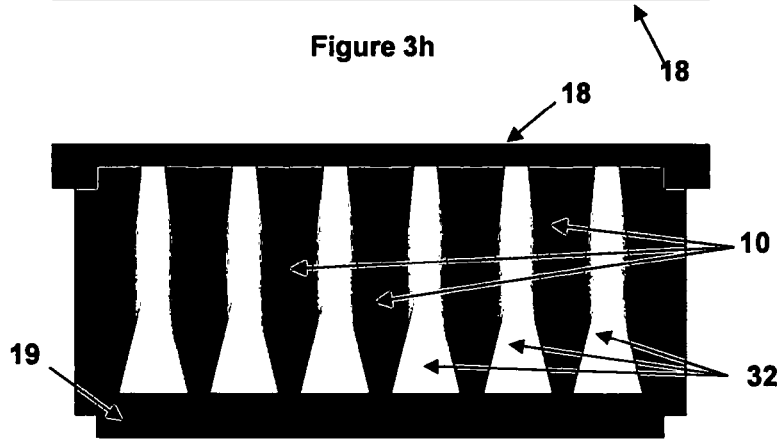
Figure 3K:
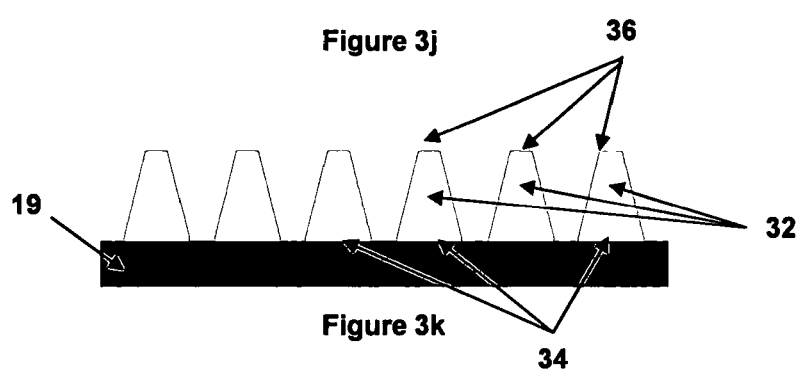

As shown in FIG. 3g, the upper support 18 is arranged in place again and the apparatus is inverted. The container 20 and lower support 16 are then removed leaving the mould 10 and upper support 18 in place. The sinter plate 19 is then arranged in place of the lower support 16 as shown in FIG. 3h, in the recess 28 of the container 20. Referring to FIG. 3j, the apparatus is inverted once more. Finally, as shown in FIG. 3k, the upper support 18 and the mould 10 are removed to leave and the dried opal cakes 32 in place on the sinter plate 19.

The inversion processes above ensure that the dried opal cakes 32 can be arranged on the sinter plate 19 with minimal disturbance, and with the planar side 34, rather than the meniscus side 36, arranged on the sinter plate 19.

Figure 3L:
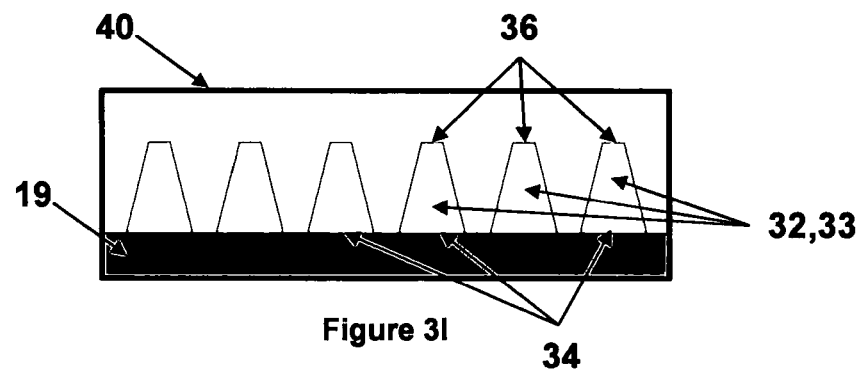

As shown in FIG. 3l, the sinter plate 19 and dried opal cakes 32 are then placed in a furnace 40 and are subject to a calcination treatment. During this treatment, the dried opal cakes 32 are heated from room temperature to 850° C. within 14 hours. The dried opal cakes 32 are then held at 850° C. for 5 hours and finally cooled down to room temperature by passive cooling. After the calcination stage, the dried opal cakes 32 have formed calcined opal products 33, which have undergone shrinkage of typically 6.5%, and which have and increased mechanical stability compared to the dried opal cakes 32.

After calcination, the sinter plate 19 and calcined opal products 33 are removed from the furnace 40. The sinter plate 19 is replaced with the lower support 16 in a reversal of the inversion process described above.

Figure 3M:
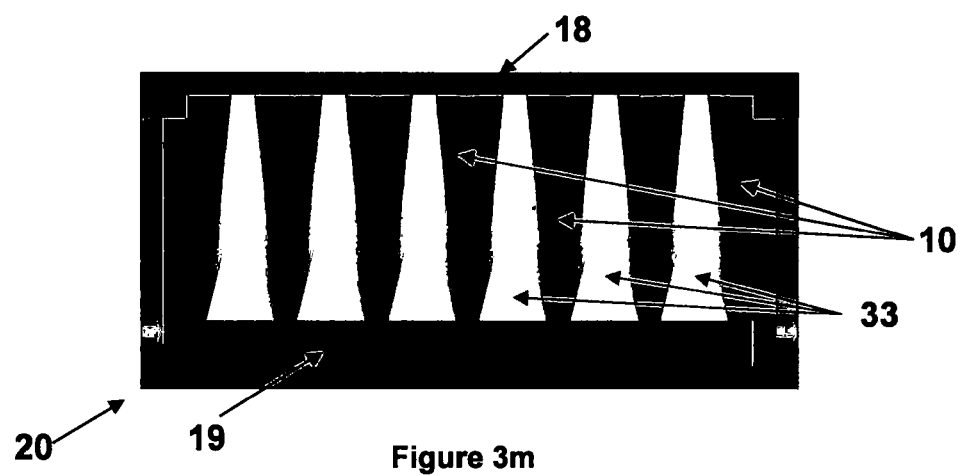
Figure 3N:
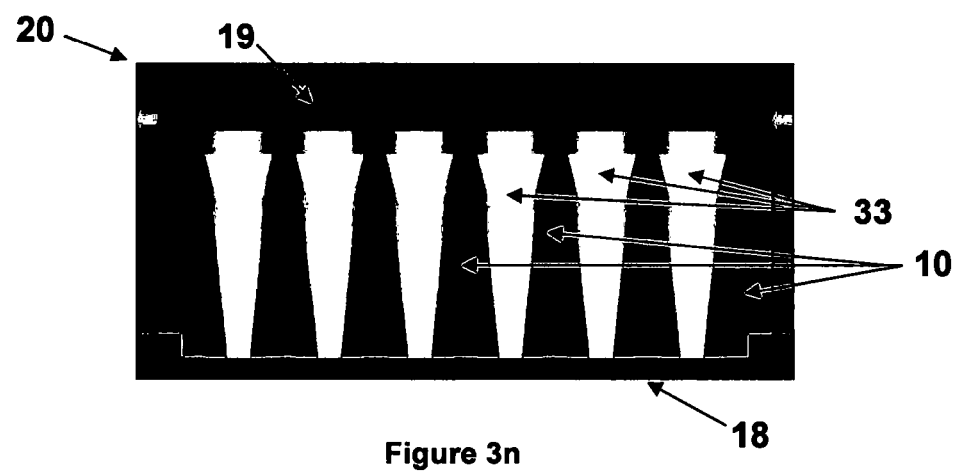
Figure 3O:
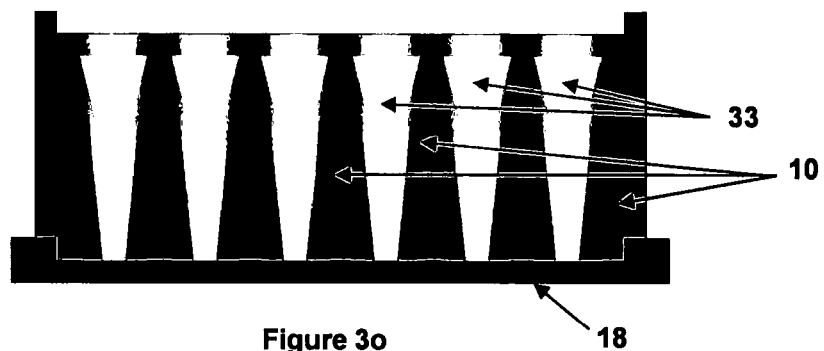
Figure 3P:
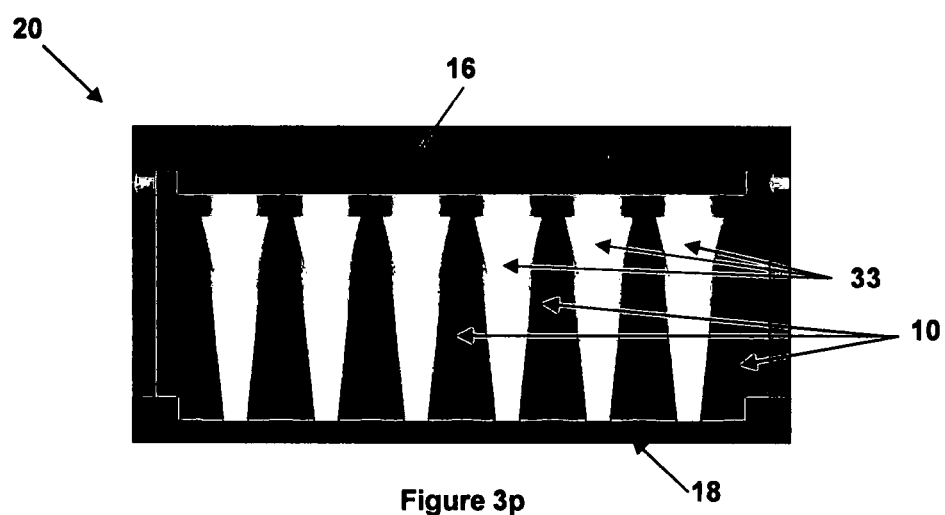
Figure 3Q:
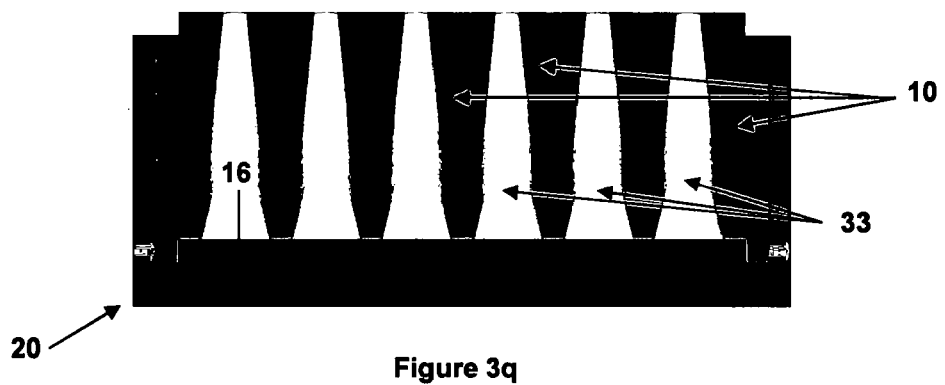

In this reversed inversion process, as shown in FIG. 3m, the mould 10 is arranged back in place over the calcined opal products 33 and the sinter plate 19, calcined opal products 33 and mould 10 are placed in the container 20. The upper support 18 is placed over the mould 10 and container 20. As shown in FIG. 3n, the apparatus is then inverted. Referring to FIG. 3o, the container 20 and sinter plate 19 are removed, and referring to FIG. 3p, the lower support 16 and the container 20 are arranged back in place. Finally, as shown in FIG. 3q, the apparatus is inverted once more and the upper support 18 is removed.

In the next stages, the voids between the ordered silica spheres are filled with a filler material, which in this case is $ZrO_2$.

A first infiltration solution 42 is prepared by mixing ethanol and a zirconium solution of 70% zirconium-n-propoxide in 1-propanol, in a ratio of 10.00 g ethanol to 3.00 g zirconium solution.

Figure 3R:
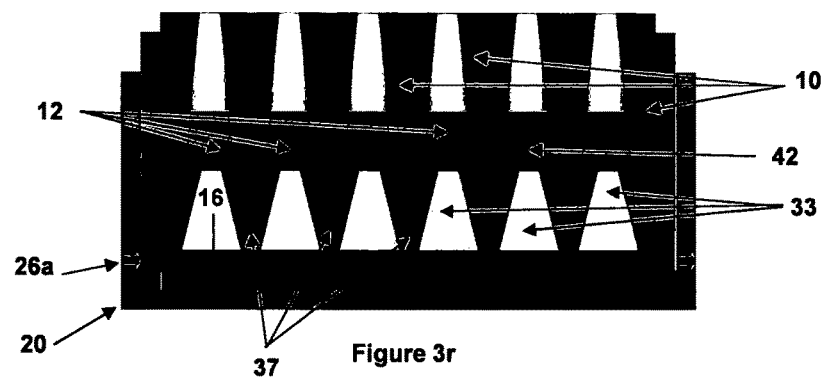

Referring to FIG. 3r, the mould 10 is lifted slightly away from the calcined opal products 33 to provide a clearance 37 around each calcined opals product 33. The first infiltration solution 42 is then introduced into the container 20 through the inlet 26a. Because of the clearance 37 around each calcined opal cake 36 the first infiltration solution 42 can enter the cavities 12 in the mould 10 to immerse the calcined opal products 33 in the first infiltration solution 42.

Figure 3S:
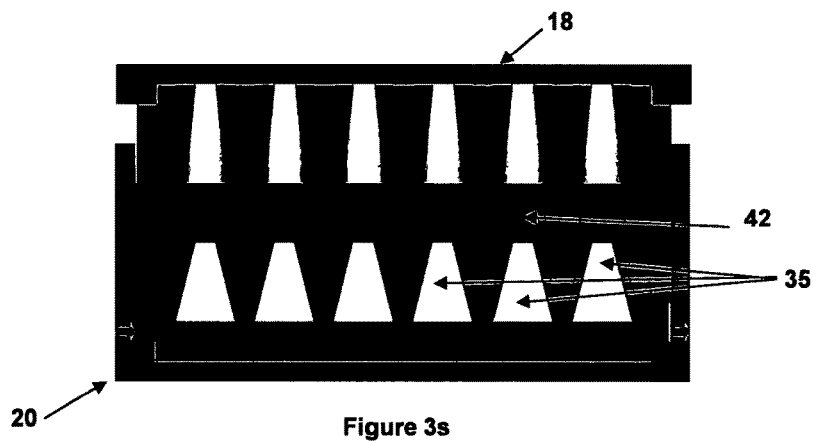
Figure 3T:
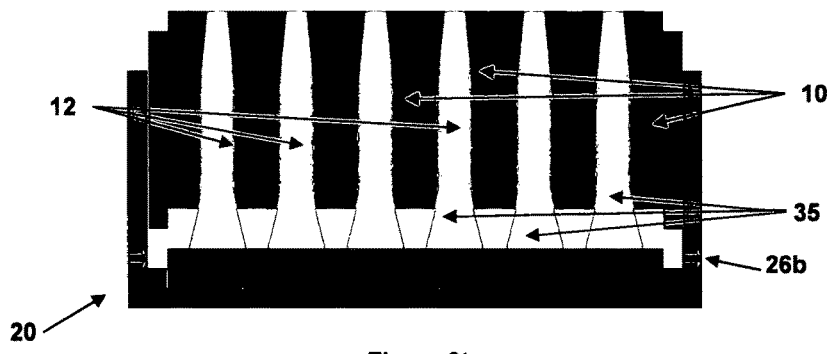

The upper support 18 is then arranged in place as shown in FIG. 3s, and the apparatus is kept in this closed configuration for 24 hours to allow the solution to infiltrate and fill any voids in the calcined opal products 33 to form infiltrated opal products 35. Referring the spheres to FIG. 3t, the upper support 18 is then removed and any remaining solution 42 in the container 20 is drained through the outlet 26b, leaving the infiltrated opal products 35 in the cavities 12 of the mould 10.

Figure 3U:
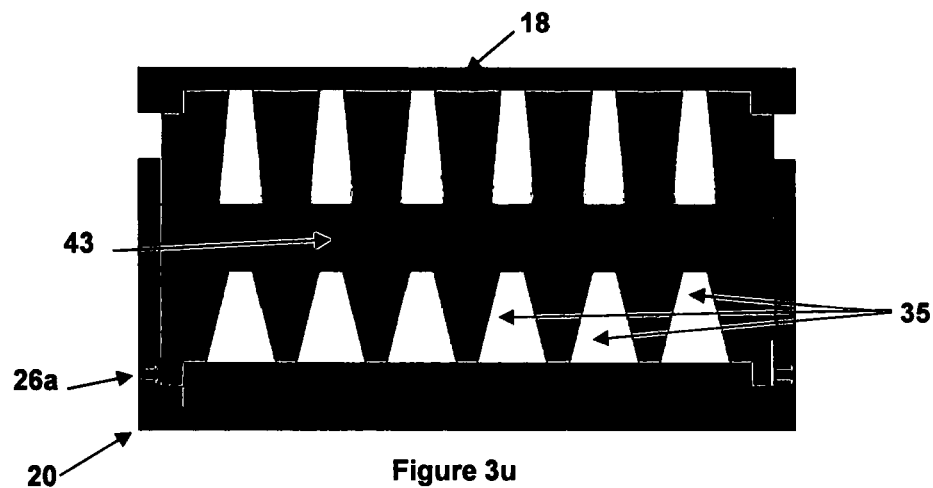

As shown in FIG. 3u, a second infiltration solution 43 is then introduced into the container 20 through the inlet 26a to immerse the infiltrated opal products 35. The second infiltration solution may be any liquid that is capable of causing the zirconium-n-propoxide in the first infiltration solution 42 to react to precipitate $ZrO_2$ that fills the voids between the silica spheres. In this example, the second infiltration solution is 0.010 mol/l solution of HCl, though other solutions may be used, such as HCl at other concentrations, or purified water.

After the second infiltration solution has been introduced, the upper support 18 is replaced, and the apparatus is left in this configuration for a further 24 hours. During this time, a reaction between the HCl in the solution 43 and the zirconium-n-propoxide in the first infiltration solution 42 contained in the infiltrated opal products 35 causes the formation and precipitation of $ZrO_2$, filling the voids between the silica particles in the infiltrated opal products 35. This process results in reacted opal products 38.

Figure 3V:
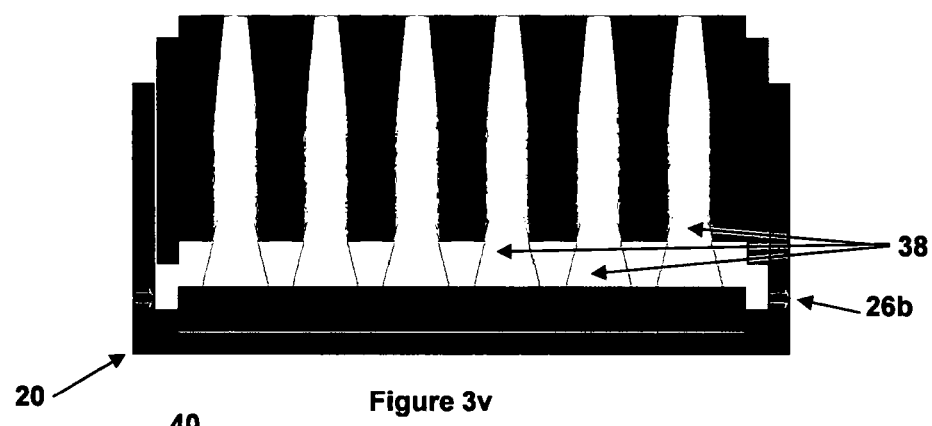
Figure 3W:
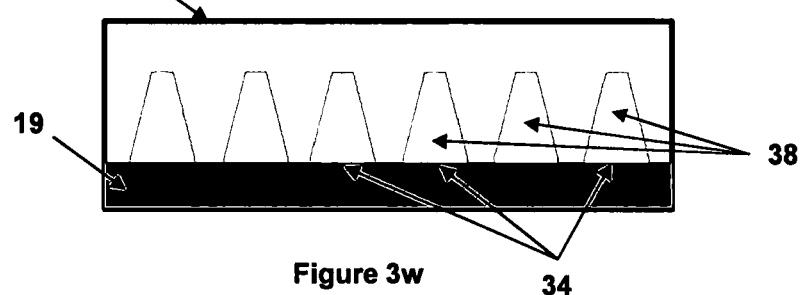

As shown in FIG. 3v, the upper support 18 is removed and the excess solution 43 is drained from the container 20 via the outlet 26b, leaving the reacted opal products 38 in place.

In a final stage, the reacted opal products 38 are sintered to produce the final raw opal product. For this sintering process, the reacted opal products 38 must be arranged once more on the sinter plate 19 with the planar side 34 arranged against the sinter plate 19. To arrange the reacted opal products 38 on the sinter plate 19 in this way, the inversion process already described in relation to FIGS. 3g to 3k is repeated once more. For brevity, this process will not be described again in detail.

The sinter plate 19 and reacted opal products 38 are placed in the furnace 40 once more to undergo sintering. In this sintering process, the reacted opal products 38 are heated from room temperature to 1,275° C. over a period of 12 hours, and held at 1,275° C. for 12 hours. The furnace 40 is then controlled-cooled to 600° C. over a period of 4.5 hours before being passively cooling to room temperature.

Figure 3X:
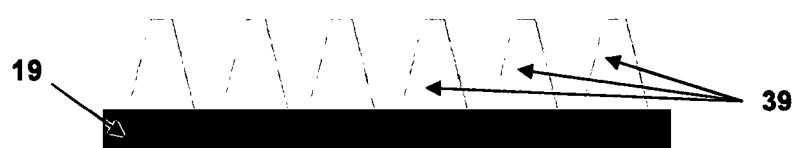

After the sintering process, the sinter plate 19 is removed from the furnace 40 with raw opal products 39 on the sinter plate 19, as shown in FIG. 3x. The raw opal products 39 can then be processed as required, for example by cutting or grinding into a required shape to give a finished opal.

In an alternative embodiment, as shown in FIGS. 4a to 4g and 5a to 5h, the mould takes to form of vial arrangement.

Figure 4A:
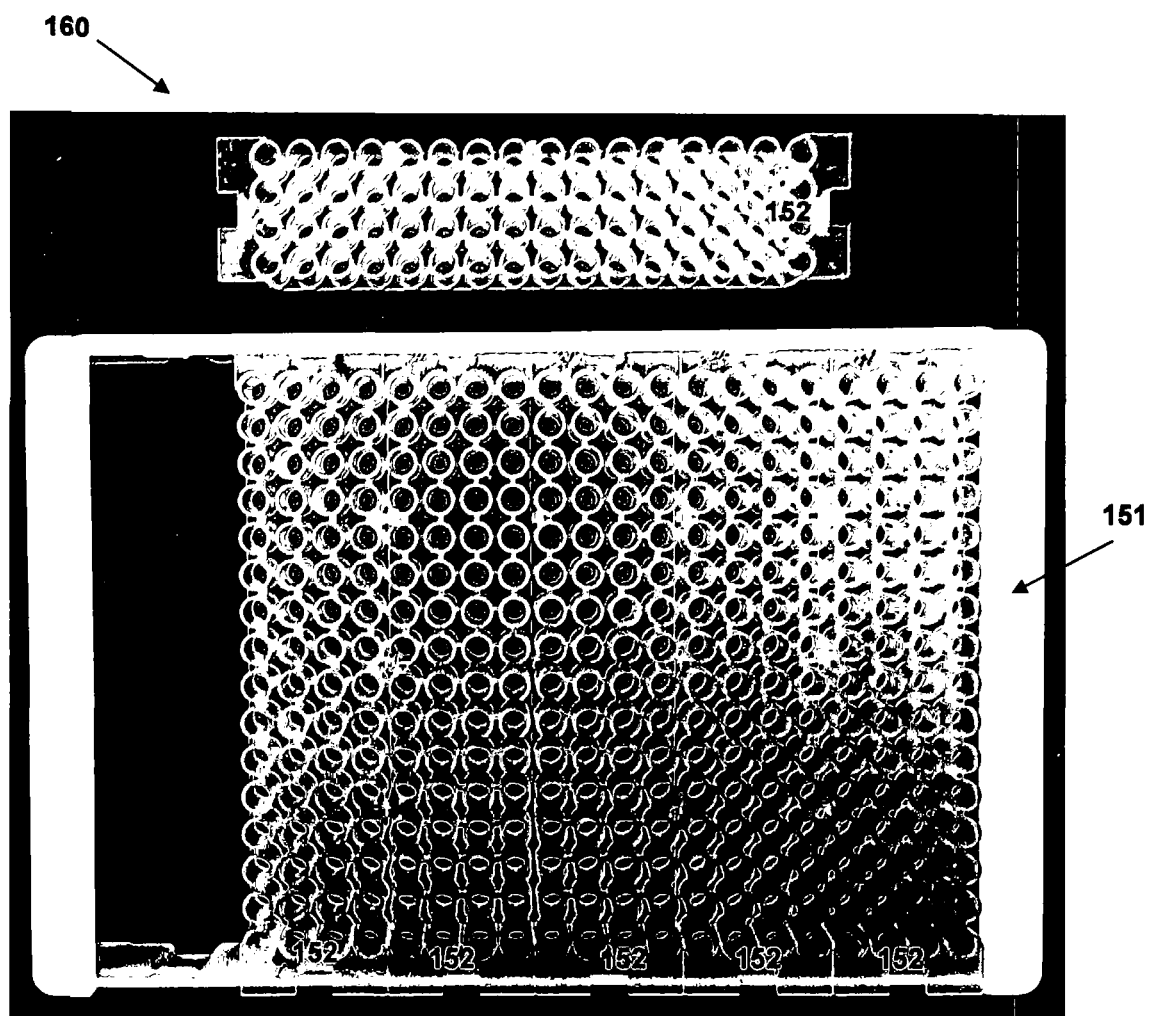
FIG. 4a is a perspective views of a modular mould arrangement that may be used in alternative apparatus for making a plurality of photonic crystals.

FIG. 4a shows the assembled vial arrangement, which takes the form of a specially-designed microwell plate arrangement 150 made of untreated polypropylene.

Figure 4B:
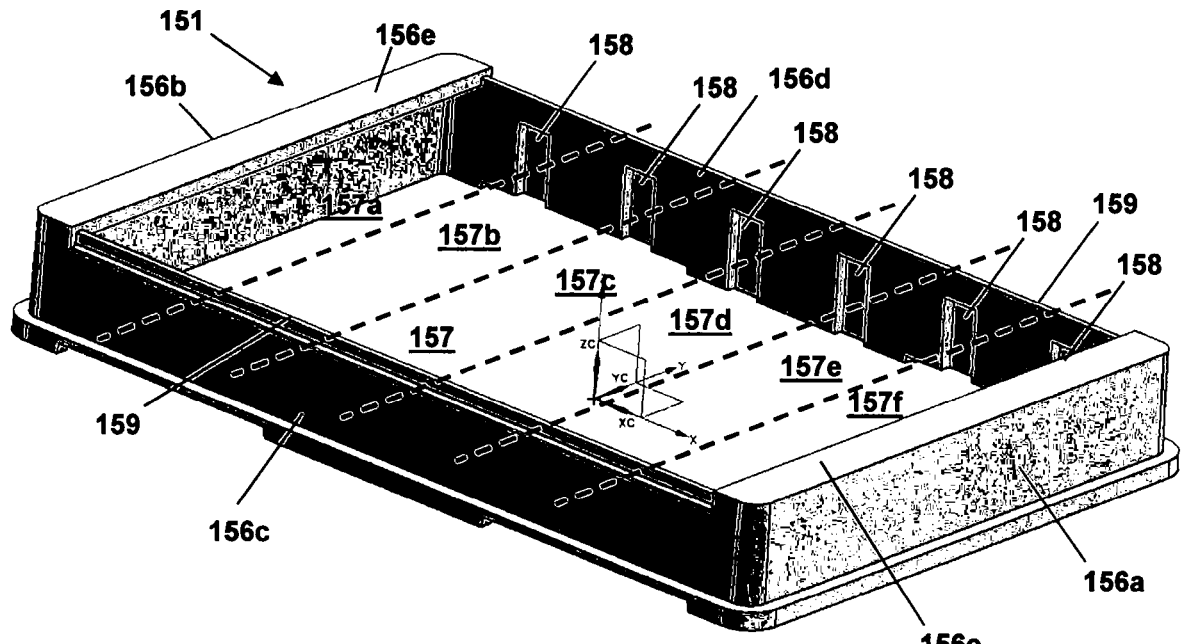

The arrangement 150 consists of a support in the form of a frame 151, shown in isolation in FIG. 4b, and a plurality of mould modules 152 in the form of vial arrays. Variations of different vial arrays 152a, 152b, 152c, 152d, 152e, are shown in isolation FIGS. 4c to 4g. A plurality of such vial arrays 152 can be fitted into and removed from the frame 151 as desired to provide a modular mould arrangement, as will be explained.

Figure 4C:
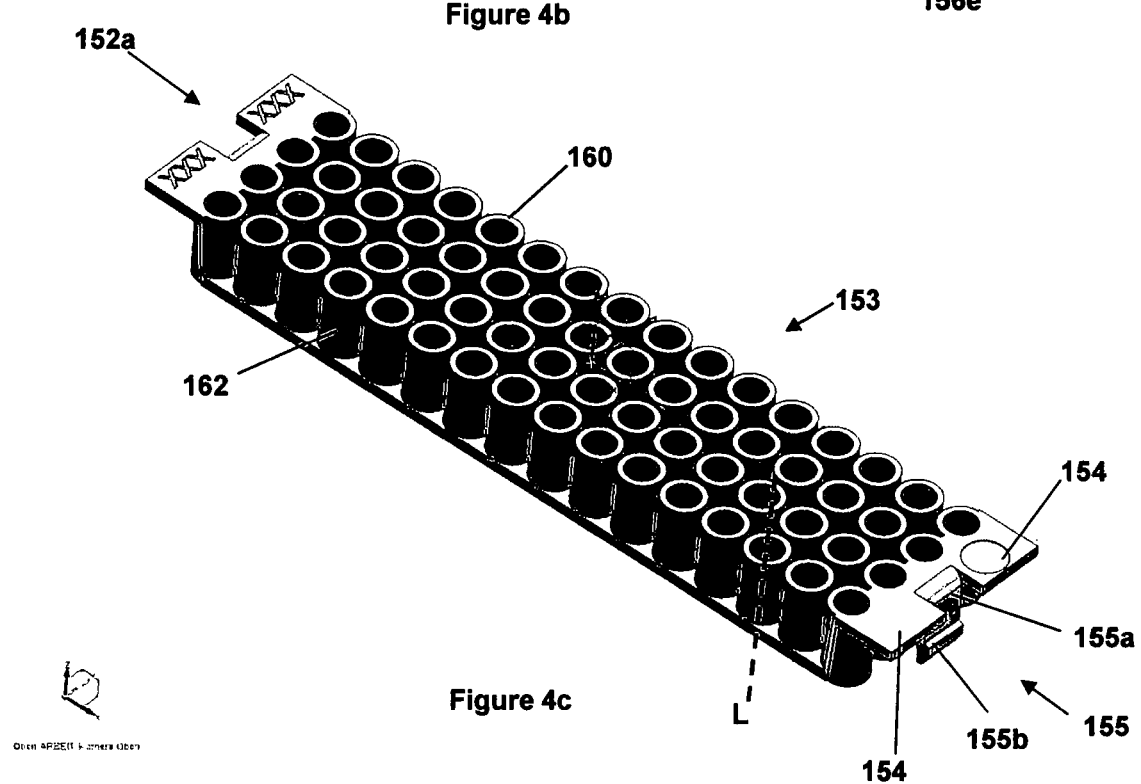
Figure 4D:
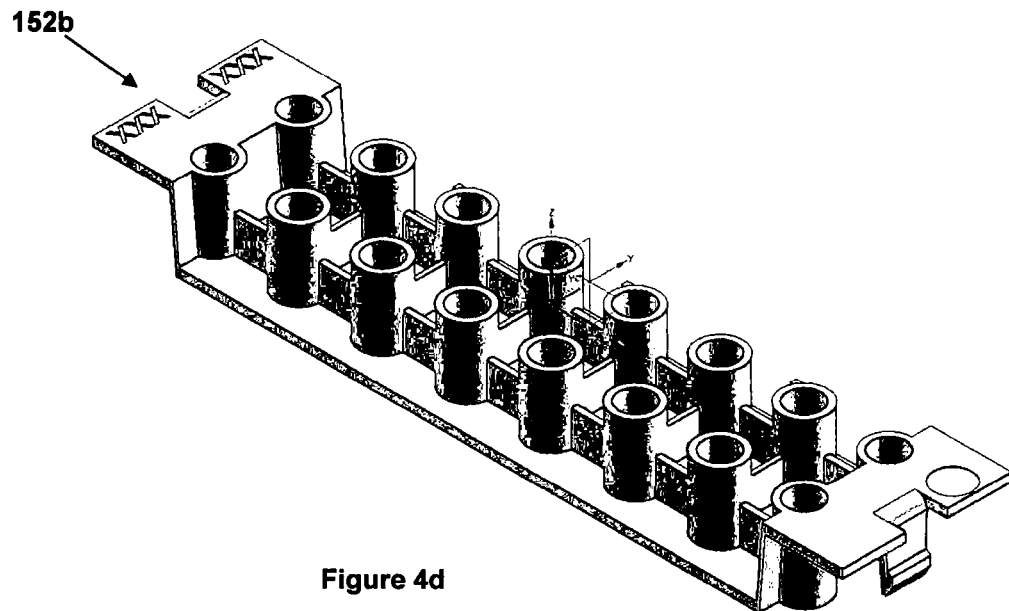
Figure 4E:
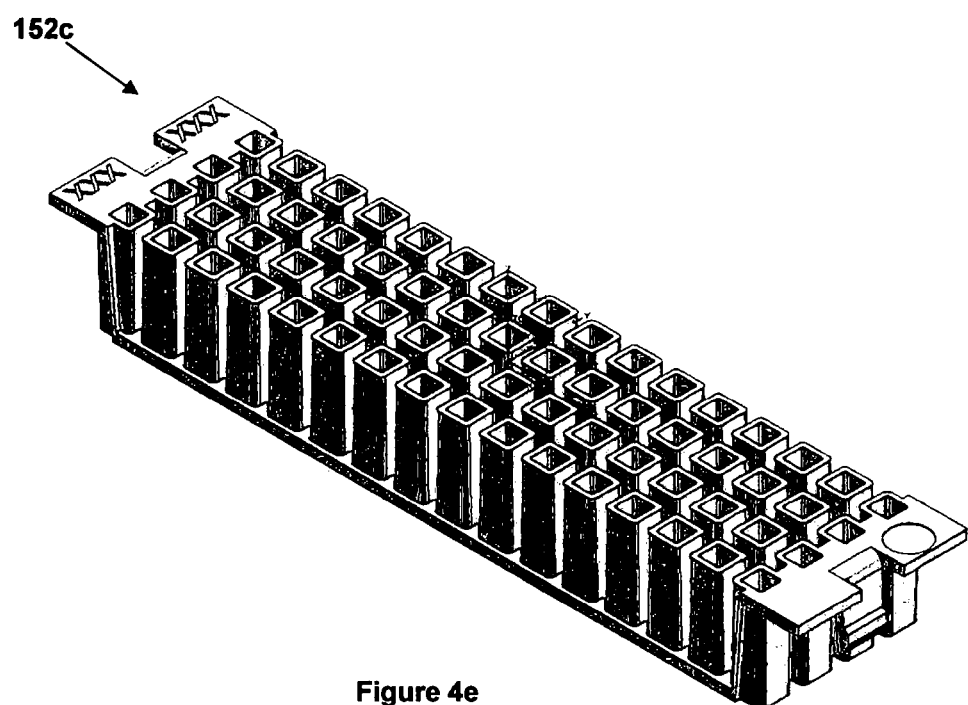
Figure 4F:
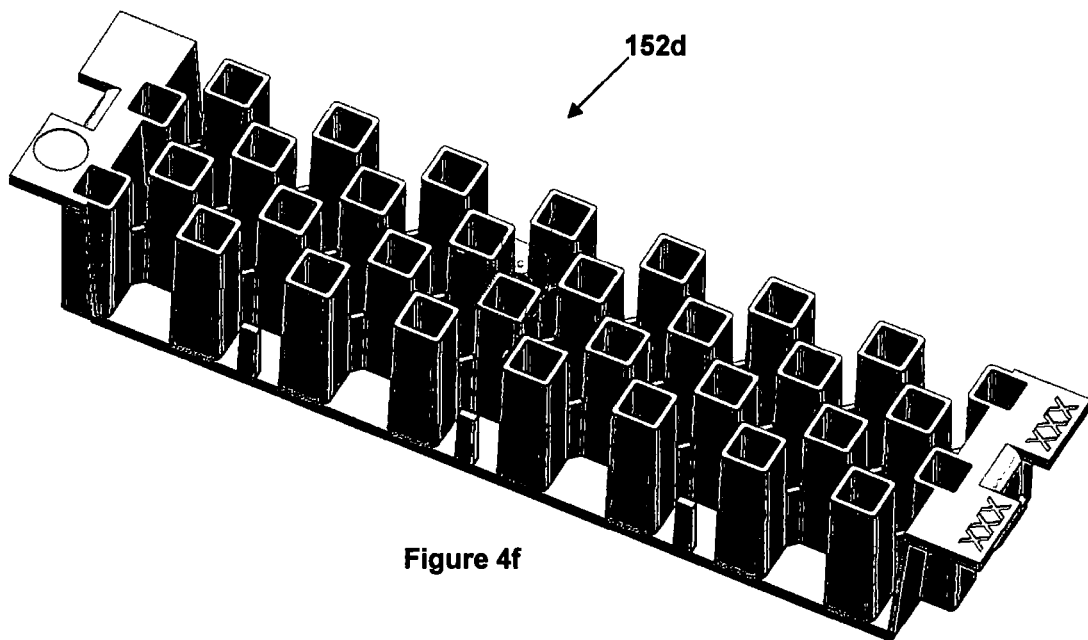
Figure 4G:
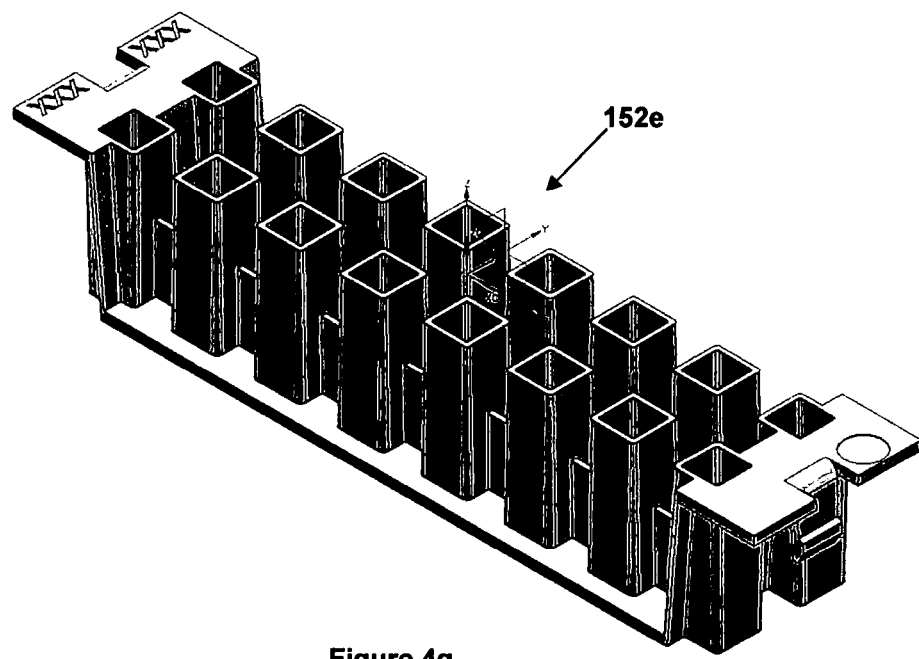

Referring to FIG. 4c, the vial arrays 152a each comprise a plurality of vials 160 that are connected together. Each vial 160 is defined by a surrounding wall 162 and is open at its upper end, and closed at its base by a substantially planar base wall 161 (not visible in FIGS. 4b to 4f, but visible in FIGS. 5a to 5f). In each vial array, the vials 160 may have different forms: in particular, they may have different shaped cross sections and/or different diameters. Table 1 below indicates the shapes and dimensions of the vials 160 in the vial arrays 152a, 152b, 152c, 152d, 152e in each of FIGS. 4b to 4f.

TABLE 1

| FIG. | Shape | Diameter | Volume/vial | No. in array |
|---|---|---|---|---|
| 4b | Circular | 2.75 mm | 37.4 μl | 64 |
| 4c | Circular | 3.44 mm | 70.9 μl | 16 |
| 4d | Square | 2.0 mm | 37.7 μl | 64 |
| 4e | Square | 2.63 mm | 81.9 μl | 32 |
| 4f | Square | 3.5 mm | 174.6 μl | 16 |

Considering in particular the vial array 152a of FIG. 4c, the vial array 152a comprises a mould body 153 having a plurality of vials 160 that are connected together in a single piece. In the example of FIG. 4c, the surrounding wall 162 of each vial 160 is shaped as a cylindrical shell, so that each vial 160 has a circular cross-section.

On an upper surface of the main body 153, adjacent to the open ends of the vials 160, the ends of the main body 153 terminate with two spaced-apart lugs 154. The lugs 154 extend outwardly, away from the vials 160, in a direction that is perpendicular to a longitudinal axis L of the vials 160.

A catch 155 is provided in the space between the two lugs 154. The catch 155 comprises a downwardly-depending tab 155a that extends in a direction parallel to the longitudinal axes of the vials. At the downward-most end of the tab 155a is a protrusion in the form of a ridge 155b that extends outwardly in the same direction as the lugs 154. In use, the ridge 155b engages with a corresponding recess on the frame 151 to secure the vial array 154a to the frame 151.

Referring to FIG. 4b, the frame 151 comprises front and rear end walls 156a, 156b and left and right side walls 156c, 156d. Together, the walls 156a, 156b, 156c, 156d define a perimeter that surrounds a central space 157. At front and rear ends of the frame 151, a horizontal upper wall 156e extends inwardly a short distance from the respective front or rear wall. These horizontal upper walls 156e act as reinforcements that lend structural integrity to the frame 151.

The left and right side walls 156c, 156d have inner surfaces that face towards the central space 157. The inner surfaces are provided with elongate recesses 158 that are spaced apart at regular intervals along the walls 156c, 156d. Each recess 158 has a width that is substantially the same as the width of the ridge 155b on the catch 155 of the vial array 152*a*. A spacing between the recesses is substantially equal to a width of a single vial array 152*a*.

The recesses 158 extend only part of the way up the left and right side walls 156*c*, 156*d*. In particular, each recess 158 terminates a short distance away from the uppermost surface of the left or right side wall 156*c*, 156*d*. This distance from the uppermost surface corresponds to the length of the downwardly-depending tab member 155*a* of the catch 155 of the vial array 152.

The central space 157 defined by the frame 151 comprises a plurality of vial zones 157*a*, 157*b*, 157*c*, 157*d*, 157*e*, 157*f*. In use, each zone 157*a*, 157*b*, 157*c*, 157*d*, 157e, 157*f* receives a different vial array, and each zone 157*a*, 157*b*, 157*c*, 157*d*, 157*e*, 157*f* is therefore associated with a pair of recesses 158, one recess of the pair being on the left side wall 156*c* and one recess of the pair being on the right side wall 156*d*.

To fit the vial array 152 into the frame 151, the user arranges the vial array 152 over the frame 151, with the vial array 152 aligned with a corresponding vial zone, and hence with the catches 155 of the vial array 152 aligned with a corresponding pair of recess 158 in the frame 151. The user pushes the vial array 152 downwardly, so that the side walls 156*c*, 156*d* of the frame push against the ridges 155*b* of the catches 155. The vial array 152 has been pushed down sufficiently far when the lugs 154 of the vial array 152 are brought into contact with support surfaces 159 defined by the tops of the left and right side walls 156*c*, 156*d* of the frame 151. At this point, the ridges 155*b* of the catches 155 have reached the recess 158 in the side walls 156*c*, 156*d*, and the ridges 155*b* snap into place in the recesses, thereby effecting a snap fit.

Further vial arrays are fitted to the other zones of the frame 151. Some or all of these further vial arrays may be identical to the first vial array. Alternatively, different vial arrays 152*a*, 152*b*, 152*c*, 152*d*, 152*e* may be arranged in place in different zones of the frame 151, thereby allowing opals of different shapes and sizes to be made in the same frame and as part of the same batch. This allows great flexibility in the manufacturing process, so that supply can easily be adapted in accordance with demand.

The method of making opals using a vial arrangement, such as the vial arrangement of of FIGS. 4*a* to 4*g*, or a conventional vial array such as a standard microwell plate, will now be described with reference to FIGS. 5*a* to 5*h*.

In this case, the vial array is shown schematically, and the remaining apparatus is similar to the apparatus described above in relation to FIGS. 3*a* to 3*x*, except that the container and upper and lower support plates may be omitted from the apparatus, and the vials 160 may be filled simultaneously using a multi-head pipette 170.

In this filling stage, shown in FIG. 5, the vials 160 are simultaneously filled with the pre-prepared liquid dispersion 130 described above via a multi-head pipette 170 having pipette head at spacings that correspond to the positions of the vials in the vial array. For example, for a 64-vial array, the multi-head pipette may be a T.I.P.S.® Eppendorf re-usable 64-tip pipette. Each vial is filled with a set volume of the liquid dispersion 130, for example 23.7 microlitres of dispersion, i.e. a total of 1.5 ml over the entire 64 vial array.

In the event that the microplate arrangement comprises different vial arrangements in different zones, different multi-head pipettes may be used to fill vials in different zones as appropriate.

In one embodiment not depicted in the figures, the vials are closed off using individual screw-cap lids during the subsequent sedimentation stage to avoid disturbance during sedimentation. In this embodiment, after sedimentation is complete, the lids are removed for the drying stage.

In an alternative embodiment not depicted in the figures, to accelerate the sedimentation stage and reduce the cost of the process, the lids are omitted, and instead the microwell plate is placed inside a humidity-controlled atmosphere such as a closed desiccator. Humidity within the desiccator is controlled by providing a dish on the bottom of the desiccator that is filled with a dilute ammonia solution. The ammonia solution has a concentration that is equal to the concentration of the ammonia solution added to the pre-prepared liquid dispersion, which in this example is 32%. In a particular example, the relative humidity is maintained at 95%.

In this embodiment, the drying process may also take place in a desiccator, though for the drying process no ammonia solution is present. Conducting the drying stage in the desiccator additionally speeds up the drying process.

After the drying process the dried opal cakes 132 are calcined. Since the vials 160 are closed at their base, the inversion process that is necessary to arrange the dried opal cakes 132 with their planar sides 134 against the sinter plate 119 must be carried out in a different manner to that described above.

Figure 5A:
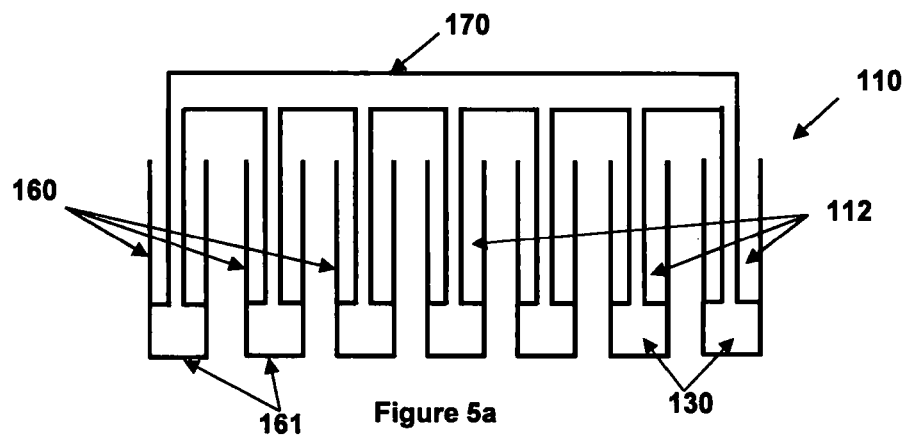
Figure 5B:
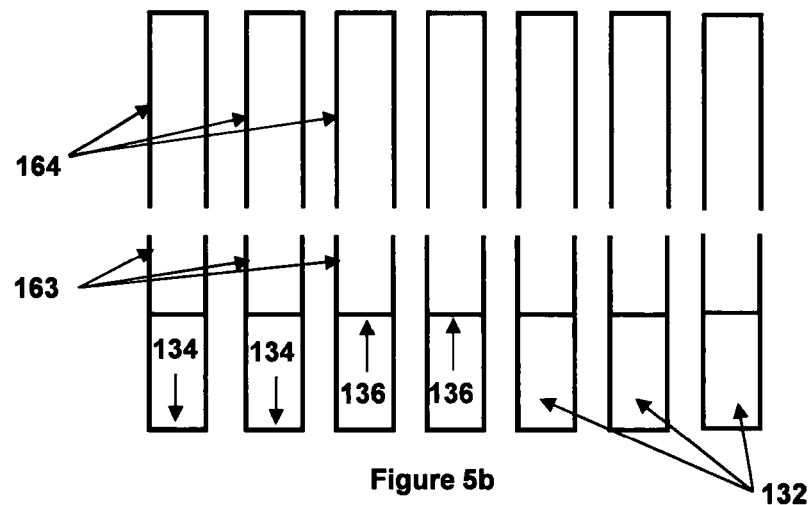
Figure 5C:
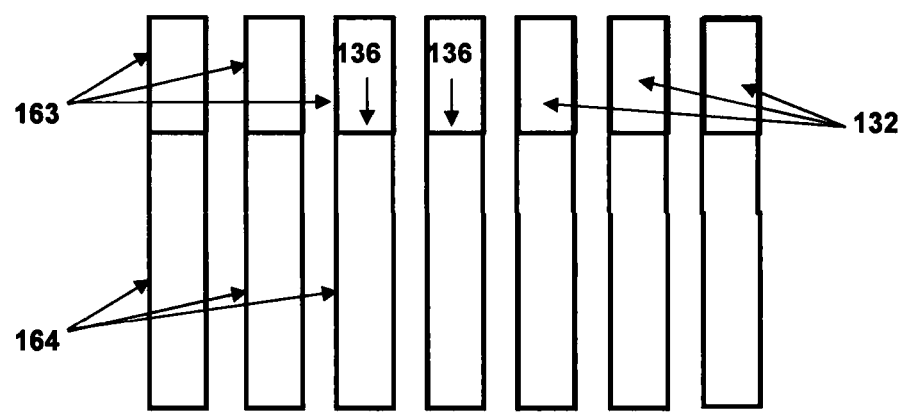
Figure 5D:
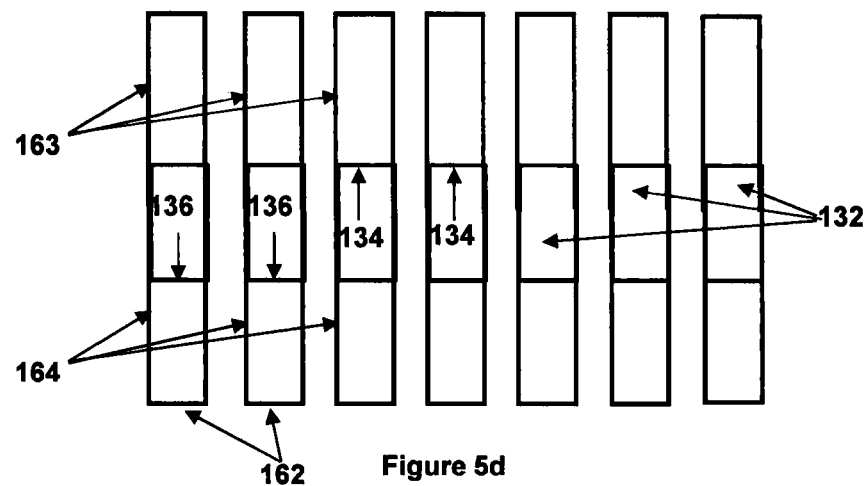

Referring to FIG. 5*b*, with the dried opal cakes 132 arranged in a first vial array 163, a second vial array 164 is placed over the first vial array 163, with the openings of corresponding vials aligned. Next, as shown in FIG. 5*c*, the arrangement is inverted. Under the action of gravity, the dried opal cakes 132 gently slide into the second array of vials 164, in an inverted position shown in FIG. 5*d*, i.e. with the meniscus sides 136 of the dried opal cakes 132 facing towards the closed bases 161 of the second vial array 164 and the planar sides 134 facing towards the openings 165 of the second vial array 164.

Figure 5E:
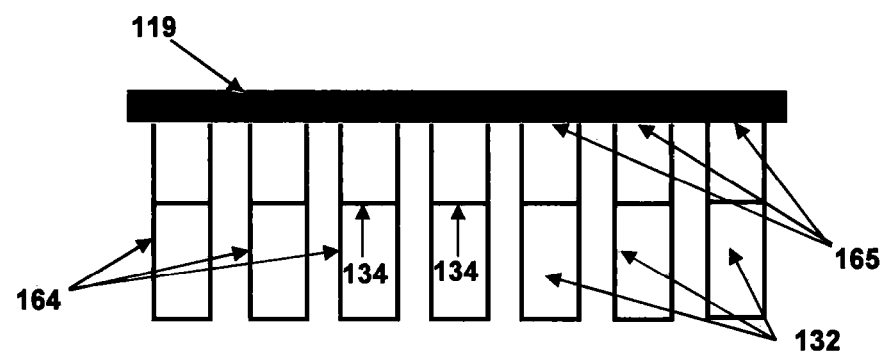
Figure 5F:
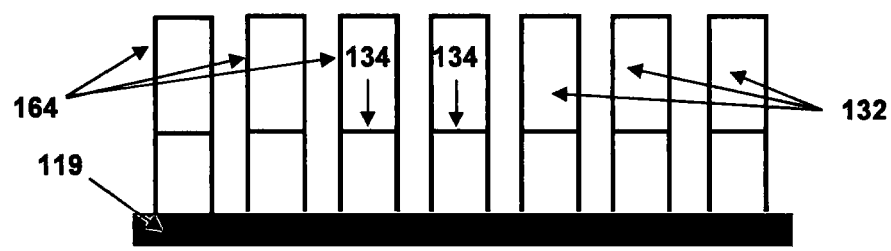
Figure 5G:
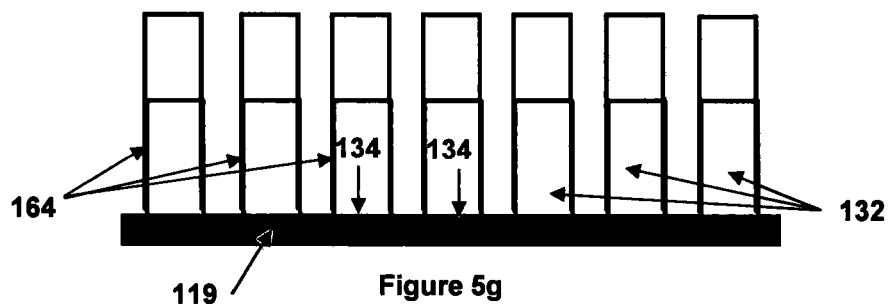
Figure 5H:
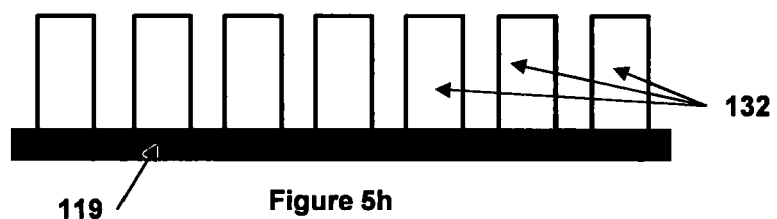

The first vial array 163 is then set aside, and the sinter plate 119 is arranged over the openings 165 of the second vial array 164 as shown in FIG. 5*e*. As shown in FIG. 5*f*, the arrangement is then inverted once more, and as shown in FIG. 5*g*, the dried opal cakes 132 then slide onto the sinter plate 119, with their planar sides 134 against the plate 119. Finally, as shown in FIG. 5*h*, the second vial array 164 is removed leaving the dried opal cakes 132 in place on the sinter plate 119 for calcination.

The calcination process is substantially the same as the calcination process already described above. After calcination, the calcined opal products are arranged back in the first vial array 163 in a reverse of the inversion process described. In this case, the second vial array 164 is arranged over the calcined opal products and the arrangement is inverted. The sinter plate 119 is removed, and the first vial array 163 is arranged over the second vial array 164 with the openings aligned. The arrangement is inverted again, and the calcined opal products slide back into the first vial array with their planar sides facing the closed base of the vial.

The vials are then filled with the infiltration liquid already described above using the multihead pipette, and are subject to the same infiltration process. The infiltration liquid is removed by pipette and replaced with an HCl solution in the same manner as described above, and the same precipitation of $ZiO_2$ occurs.

The excess HCl solution is removed and the reacted opal products are then inverted onto the sinter plate 119 making use of the second vial array 164 in the manner already described, before being subjected to the sintering treatment already described to produce the raw opal product.

The above process provides an effective means of producing large quantities of high-quality synthetic opals in an efficient manner. The through-put is higher as a result of the ability to create many opals simultaneously, and the reduction of time required for individual process steps. A single mould can be used to produce opals of different shapes and sizes as required according to demand, thereby providing a flexible manufacturing process. The quality of the finished opals, in particular the fire and transparency of the opals, is improved as a result of improved ordering of the silica spheres.

EXAMPLES

Example 1

A liquid dispersion was made using the batch method described in relation to FIGS. 2a and 2b above. Silica spheres of 450 nm diameter were used, with 100 g of silica spheres in 120 g water. 5.7 ml of ammonia with 32% concentration was added to the dispersion. The liquid dispersions underwent no, one, two or three ultrasound treatments as indicated in Table 2 below.

The liquid dispersions were then used to make opal cakes using the microtiter plate method described above. Each vial of the microtiter plate was filled with 375 microlitres of dispersion liquid and the dispersion liquid was left to settle, then dried and calcined.

In a first impregnation stage, a first impregnation liquid was pipetted into the vials and left for 24 hours to impregnate, which consisted of 55.38 g of 70% zirconium (IV) n-propoxide in 1-propanol with 184.6 g absolute ethanol. In a second impregnation stage, a second impregnation liquid was pipetted into the vials and left for 24 hours to impregnate, which consisted of 240.0 g 0.01 mol/L HCl.

After the final sintering step, the resulting opal cakes were inspected visually to determine i) structural integrity and ii) aesthetic quality. Structural integrity was assessed based on whether the opal cake was a) whole and free of cracks or flaws b) whole but with cracks or flaws present or c) broken into multiple pieces. The assessment of aesthetic quality was based on the observed transparency and fire of the finished opal. An opal of high quality will have a high transparency and a high fire (i.e. when the opal disperses the incoming light into different wavelengths, the beams corresponding to the different wavelengths are well-separated, such that different colours are distinctly visible in the outgoing light).

Results of the visual inspection are shown in Table 2 below.

The inventors found that without the ultrasound treatment the presence of agglomerates meant that the liquid dispersion could not be passed through a pipette tip, because the tip became clogged immediately. With only one or two ultrasound treatments, the yield was good and the aesthetic quality adequate. With three ultrasound treatments the yield of good samples was the highest, and the aesthetic quality was superior.

Example 2

Liquid dispersion samples were made as per Sample 1 of Example 1 above (i.e. with three ultrasound treatments), but with a varying quantity of ammonia solution in the liquid. Opal cakes were made using the same method described above in relation to Example 1, and the same visual inspections were carried out. The results are shown in Table 3 below.

TABLE 3

| Sample | Amount of NH$_3$ (32% solution)/ml | Assessment of samples produced | | | Visual inspection |
|---|---|---|---|---|---|
| | | Good/% | Cracked/% | Broken/% | |
| 5 | 0.00 ml | 94.5 | 5.3 | 0.3 | Adequate |
| 6 | 1.00 ml | 91.1 | 6.3 | 2.6 | Adequate |
| 7 | 2.00 ml | 98.8 | 1.2 | 0.0 | Adequate |
| 8 | 3.00 ml | 91.6 | 8.1 | 0.3 | Adequate |
| 9 | 4.00 ml | 95.3 | 4.4 | 0.3 | Adequate |
| 10 | 5.00 ml | 89.7 | 9.7 | 0.5 | Superior |
| 11 | 5.70 ml | 98.7 | 1.0 | 0.3 | Superior |
| 12 | 6.00 ml | 94.8 | 5.2 | 0.0 | Superior |
| 13 | 7.00 ml | 94.7 | 5.3 | 0.0 | Superior |
| 14 | 8.00 ml | 93.4 | 6.6 | 0.0 | Superior |
| 15 | 9.00 ml | 94.2 | 5.2 | 0.5 | Superior |
| 16 | 10.00 ml | 95.3 | 3.7 | 1.0 | Superior |

The inventors found that the presence of at least 2 ml of ammonia solution resulted in an improved yield, and that a presence of at least 5 ml of ammonia provides a superior aesthetic quality. For reasons of health and safety, it is desirable to keep the ammonia quantity to a minimum, and thus a quantity of 5.7 ml was selected as a providing a particularly desirable balance between opal quality and health and safety considerations.

Although in the examples and embodiments above the spheres are silica spheres and the filler material is zirconia, other suitable materials may be employed for the spheres and filler materials. Any suitable number of photonic crys-

TABLE 2

| Sample | Ultrasound treatment time 1 | Ultrasound treatment time 2 | Ultrasound treatment time 3 | Comments | Assessment of samples produced | | | Visual inspection |
|---|---|---|---|---|---|---|---|---|
| | | | | | % good | % cracked | % broken | |
| 1 | 5 min | 5 min | 5 min | — | 98.7 | 1.0 | 0.3 | superior quality |
| 2 | — | — | — | Pipetting was impossible because pipette tips were clogged immediately | n/a | n/a | n/a | n/a |
| 3 | 5 min | — | — | — | 97.6 | 1.8 | 0.5 | adequate quality |
| 4 | 5 min | 5 min | — | — | 98.4 | 1.6 | 0.0 | adequate quality | tals may be manufactured using the method above, and the photonic crystals may be of any appropriate shape or size.

It will be appreciated that other variations are possible within the scope of the invention as set out in the claims.

The invention claimed is:

1. A method of making a liquid dispersion for manufacture of a photonic crystal, the method comprising:
   dispersing monodispersed spheres in a liquid to form a liquid dispersion;
   subjecting the liquid dispersion to a first ultrasonic treatment and
   subjecting the liquid dispersion to a second ultrasonic treatment.

2. The method of claim 1, comprising dispersing the monodispersed spheres in water to form the liquid dispersion.

3. The method of claim 2, comprising adding ammonia solution to the liquid dispersion.

4. The method of claim 1, comprising allowing the liquid dispersion to cool between the first and second ultrasonic treatments.

5. The method of claim 3, comprising adding ammonia solution to the liquid dispersion after subjecting the liquid dispersion to the first ultrasonic treatment.

6. The method of claim 1, comprising subjecting the liquid dispersion to the first ultrasonic treatment for an ultrasonic treatment period, the ultrasonic treatment period having a duration that is between approximately 10 seconds and approximately 20 minutes.

7. The method of claim 1, wherein the monodispersed spheres have a mean diameter of between 300 nm and 600 nm.

8. The method of claim 1, comprising continuously feeding the liquid dispersion into a first ultrasound volume to undergo the first ultrasonic treatment.

9. The method of claim 8, comprising continuously feeding the liquid dispersion from the first ultrasound volume to a first cooling volume to undergo cooling, and continuously feeding the liquid dispersion from the first cooling volume to the first ultrasound volume or to a second ultrasound volume to undergo the second ultrasonic treatment.

10. The method of claim 9, comprising pumping the liquid dispersion through the first ultrasound volume for the first ultrasonic treatment at a first flow rate and pumping the liquid dispersion through the first or second ultrasound volumes for the second ultrasonic treatment at a second flow rate, the second flow rate being lower than the first flow rate.

11. An apparatus for continuously making a liquid dispersion for use in making a photonic crystal, the apparatus comprising:
   an ultrasound volume comprising an ultrasound apparatus for applying an ultrasound treatment to a liquid;
   a cooling volume in fluid communication with the ultrasound volume for cooling treated liquid dispersion received from the ultrasound volume into the cooling volume; and
   a pump for pumping the treated liquid dispersion from the ultrasound volume to the cooling volume;
   a further ultrasound volume in fluid communication with the cooling volume;
   a further cooling volume in fluid communication with the further ultrasound volume; and
   a further pump for pumping the treated liquid dispersion from the cooling volume to the further cooling volume via the further ultrasound volume.

12. The apparatus of claim 11, wherein the further pump is configured to pump the treated liquid dispersion at a slower rate than the pump.

13. A method of making a photonic crystal, the method comprising:
   making a liquid dispersion according to the method of claim 1;
   providing a mould having a liquid-receiving cavity;
   filling the cavity with the liquid dispersion;
   allowing the monodispersed spheres to sediment;
   allowing the sedimented spheres to dry; and
   filling the spheres with a filler material to form the photonic crystal.

14. The method of claim 13, wherein the photonic crystal is a synthetic opal.

15. A photonic crystal, wherein the photonic crystal is produced by the method of claim 13.

16. A method of making a liquid dispersion for manufacture of a photonic crystal, the method comprising:
   dispersing monodispersed spheres in a liquid to form a liquid dispersion;
   continuously feeding the liquid dispersion into a first ultrasound volume; and
   subjecting the liquid dispersion to a first ultrasonic treatment.

17. The method of claim 16, comprising continuously feeding the liquid dispersion from the first ultrasound volume to a first cooling volume to undergo cooling, and continuously feeding the liquid dispersion from the first cooling volume to the first ultrasound volume or to a second ultrasound volume to undergo the second ultrasonic treatment.

18. The method of claim 17, comprising pumping the liquid dispersion through the first ultrasound volume for the first ultrasonic treatment at a first flow rate and pumping the liquid dispersion through the first or second ultrasound volumes for the second ultrasonic treatment at a second flow rate, the second flow rate being lower than the first flow rate.

* * * * *